United States Patent [19]
Kanai et al.

[11] Patent Number: 5,006,180
[45] Date of Patent: Apr. 9, 1991

[54] PIN HETEROJUNCTION PHOTOVOLTAIC ELEMENTS WITH POLYCRYSTAL GAP (H,F) SEMICONDUCTOR FILM

[75] Inventors: Masahiro Kanai, Tokyo; Tatsuyuki Aoike; Koichi Matsuda, both of Nagahama; Soichiro Kawakami, Hikone, all of Japan

[73] Assignee: Canon Kabushiki Kaisha, Tokyo, Japan

[21] Appl. No.: 467,538

[22] Filed: Jan. 19, 1990

[30] Foreign Application Priority Data

Jan. 21, 1989 [JP] Japan .................. 1-12507

[51] Int. Cl.$^5$ ............... H01L 31/075; H01L 31/0368; H01L 31/0376
[52] U.S. Cl. .................... 136/258; 136/249; 136/262; 357/30; 357/59
[58] Field of Search .............. 136/249 TJ, 258 PC, 136/258 AM, 262; 357/30 B, 30 E, 30 J, 30 K, 59 C, 59 D

[56] References Cited

U.S. PATENT DOCUMENTS 4,365,107 12/1982 Yamauchi .................. 136/258

FOREIGN PATENT DOCUMENTS 61-6874 1/1986 Japan .................. 136/258

Primary Examiner—Aaron Weisstuch
Attorney, Agent, or Firm—Fitzpatrick, Cella Harper & Scinto

[57] ABSTRACT

A pin heterojunction photovoltaic element which generates photoelectromotive force by the junction of a p-type semiconductor layer, an i-type semiconductor layer and an n-type semiconductor layer, characterized in that at least one of said p-type and n-type semiconductor layers comprises a polycrystal semiconductor film comprised of gallium atoms (Ga), phosphorus atoms (P), hydrogen atoms (H), optionally fluorine atoms (F), and atoms (M) of a p-type or n-type dopant element, said polycrystal semiconductor film contains crystal grains of an average size in the rage of 50 to 1000 Å, and said polycrystal semiconductor film contains the hydrogen atoms (H) in an amount of 0.5 to 5 atomic %; and said i-type comprises either (a) a non-single crystal semiconductor film containing silicon atoms (Si) as a matrix and at least one kind of atoms selected from the group consisting of hydrogen atoms (H) and fluorine atoms (F) or (b) a non-single crystal semiconductor film containing silicon atoms (Si) as a matrix, at least one kind of atoms selected from the group consisting of carbon atoms (C) and germanium atoms (Ge), and at least one kind of atoms selected from the group consisting of hydrogen atoms (H) and fluorine atoms (F).

4 Claims, 5 Drawing Sheets

PIN HETEROJUNCTION PHOTOVOLTAIC ELEMENTS WITH POLYCRYSTAL GAP (H,F) SEMICONDUCTOR FILM

FIELD OF THE INVENTION

The present invention relates to an improved photovoltaic element usable as a power source not only in commercial and home appliances but also in power supply systems. More particularly, it is concerned with a pin heterojunction photovoltaic element, at least the n-type or p-type semiconductor layer of which comprises an n-type or p-type polycrystal GaP:H(F) semiconductor film which exhibits a high photoelectric conversion efficiency.

BACKGROUND OF THE INVENTION

There have been proposed a variety of photovoltaic elements such as solar cells and power sources for commercial and home appliances. They utilize pn junctions formed by ion implantation or thermal diffusion of impurities into a single crystal substrate of silicon (Si) or gallium arsenide (GaAs), or by epitaxial growth of an impurity-doped layer on such single crystal substrate. However, there is a disadvantage for any of these photovoltaic elements that they are still costly because of using an expensive specific single crystal substrate. Hence, they have not yet come into general use as solar cells or power sources in commercial and home appliances used by the general public. In order to solve this problem, there have been proposed a photovoltaic element in which there is utilized a pin junction formed by amorphous silicon (hereinafter referred to as "a-Si") semiconductor films laminated on an inexpensive substrate of a non-single crystal material such as glass, metal, ceramic, synthetic resin, etc. by way of a glow discharge decomposition method. This photovoltaic element does not provide a photoelectric conversion efficiency as high as that provided by the foregoing pn junction photovoltaic element in which a single crystal substrate is used. However, this photovoltaic element can be relatively easily produced and is of low production cost, and because of this, it is used as a power source in some kinds of appliances with very small power consumption such as electronic calculators and wrist watches.

In this pin junction amorphous silicon photovoltaic element, the Fermi level of the a-Si semiconductor having a good photoconductive property lies a little toward the conduction band from the center of the band gap and the electric field strength at the interface of the p-i junction is greater than that at the interface of the n-i junction. In this respect, it is advantageous to impinge light from the side of the p-type semiconductor layer in order to provide a desirable photoelectric conversion efficiency.

For the p-type semiconductor layer, it is desired to be formed of such a semiconductor film that does not absorb light and does not have defects since the light to be absorbed within the p-type semiconductor layer does not contribute to generation of photoelectric current in the case where defects acting as recombination centers are present therein. In view of this, for the semiconductor film to constitute the p-type semiconductor layer in the pin junction a-Si photovoltaic element, studies have been made on amorphous silicon carbide films (hereafter referred to as "a-SiC film") which are of wide band gap and also on microcrystal line silicon films (hereinafter referred to as "μC-Si film") which are known as indirect semiconductor films having small absorption coefficients and which are considered to hardly absorb light when they are of 100 to 200Å in thickness even in the case where they are of narrow band gap. As for the a-SiC semiconductor film, there is an advantage that its band gap can be widened by increasing the composition ratio of the constituent carbon atoms. However, there is a disadvantage that when its band gap is more than 2.1 eV, its film quality is markedly worsened. Therefore, there is a limit for the a-SiC semiconductor film to be used as the p-type semiconductor layer in a pin heterojunction photovoltaic element.

As for the uC-Si semiconductor film, there is still a disadvantage that its band gap is narrow in any case and the quantity of light absorbed thereby is remarkable. Particularly, when the incident light is such that it contains short-wavelength light in a large proportion, the quantity of light absorbed becomes great.

In view of this, in order to provide a desirable pin heterojunction photovoltaic element of the type wherein light is impinged from the side of the p-type semiconductor layer, it necessitates the use of a p-type semiconductor film having a desirably wide band gap and a minimized defect density as the p-type semiconductor layer.

The same situation is present also in the case of a pin heterojunction photovoltaic element of the type wherein light is impinged from the side of the n-type semiconductor layer. That is, the n-type semiconductor layer is required to be constituted by such an n-type semiconductor film having a desirably wide band gap and a minimized defect density.

Further, in the case of a so-called tandem stacked type photovoltaic element or a triple cell tandem stacked type photovoltaic element comprising a plurality of stacked cells, each cell of which comprises a pin heterojunction photovoltaic element in which the residual components of light which are left not absorbed by the upper cell are absorbed by the lower cell to obtain a sufficient photoelectric conversion, both the p-type semiconductor layer and the n-type semiconductor layer of each of the cells are required to have a desirably wide band gap and a minimized defect density.

Further, for any of the foregoing photovoltaic elements, it is required for the material to constitute the p-type or n-type semiconductor layer to be such that it can be directly deposited on a non-single crystal substrate of glass, metal, ceramic or synthetic resin in a desired state and does not give any negative effect to the i-type semiconductor layer laminated thereon.

As semiconductor films capable of providing a wide band which satisfy the foregoing requirements, GaP semiconductor films have been proposed by Japanese Patent Laid-open No. 116673/1981 (called "literature 1" hereinafter), Japanese Patent Laid-open No. 6874/1986 (called "literature 2" hereinafter), Japanese Patent Laid-open No. 189629/1986 (called "literature 3" hereinafter) and Japanese Patent Laid-open No. 189630/1986 (called "literature 4" hereinafter).

That is, literature 1 mentions a pin heterojunction solar cell in which either the p-type or n-type semiconductor layer is comprised of a p-type or n-type amorphous GaP semiconductor film (that is, a-GaP semiconductor film) prepared by the glow discharge decomposition method and the i-type semiconductor layer is comprised of an a-Si semiconductor film containing fluorine atoms (F). Literature 1 does not mention anything about a crystalline GaP semiconductor film (that is a poly-GaP semiconductor film) which is apparently distinguished from said a-GaP semiconductor film. In addition, literature 1 does not describe anything about the characteristics required for a solar cell using the said pin heterojunction photovoltaic element.

Literature 2 discloses pin junction solar cells in which the p-type semiconductor layer is comprised of a GaP film and each of the i-type and n-type semiconductor layers is comprised of a-Si film and it says that the pin junction solar cells are remarkably improved in the short-circuit current density (Isc), open-circuit voltage (Voc) and fill-factor (FF) in comparison with the known pin junction solar cells. But literature 2 does not mention anything about their solar cell characteristics and particular values of the parameters. Literature 2 does not mention anything about the process of forming the GaP film or the evaluation thereof. Literature 2 gives details neither about the a-Si film nor about the a-SiGe film.

Literatures 3 and 4 are concerned with methods of forming semiconductor films containing group III-V elements of the Periodic Table by way of the HR-CVD method (Hydrogen Radical Assisted CVD method). But neither of literatures 3 and 4 mentions anything about GaP semiconductor films.

Further, none of literatures 1 to 4 mentions a tandem type photovoltaic element or a triple cell tandem stacked type photovoltaic element.

Against this background, there is an increased social demand to provide an inexpensive photovoltaic element which exhibits a high photoelectric conversion efficiency particularly for short wavelength light and which is practically usable as a solar cell and also as a power source in various appliances.

SUMMARY OF THE INVENTION

The present invention is aimed at solving the foregoing problems relating to photovoltaic elements for use in solar cells and other appliances and satisfying the foregoing social demand.

It is therefore an object of the present invention to provide an improved pin heterojunction photovoltaic element usable in devices typified by a solar cell using an improved GaP semiconductor film which may be desirably formed even on a commercially available inexpensive non-single crystal substrate of glass, metal, ceramics or synthetic resin and which may form a desired pin junction with other films formed on such substrate.

Another object of the present invention is to provide an improved pin heterojunction photovoltaic element based on the improved GaP semiconductor film which provides a high photoelectric conversion efficiency particularly for short-wavelength light and which is usable in devices typified by a solar cell.

DETAILED DESCRIPTION OF THE INVENTION

Figure 1A:
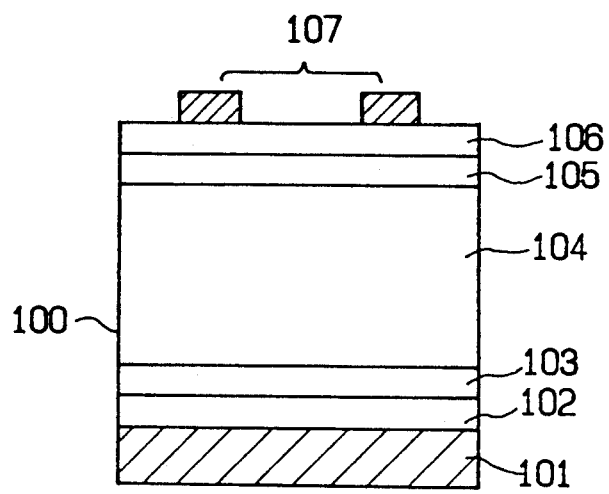
FIG. 1(A) is a schematic representation showing a typical layer structure of a pin heterojunction photovoltaic element according to the present invention.

The present inventions have made extensive studies for overcoming the foregoing problems of the known GaP semiconductor films for use in various devices such as solar cells and attaining the objects as described above and as a result, have accomplished the present invention based on the findings obtained through various experiments as below described.

That is, as a result of preparing a polycrystal GaP semiconductor film in which a specific amount of hydrogen atoms was incorporated, optionally a specific amount of fluorine atoms was additionally incorporated, and the average size of crystal grains is controlled to a specific value (this deposited film is hereinafter referred to as "poly-GaP:H(F) film"), the present inventors have found that (a) the poly-GaP:H(F) film may be formed in a desired state even on a non-single crystal substrate of glass, metal, ceramics or synthetic resin: (b) the poly-GaP:H(F) film formed on such non-single crystal substrate is accompanied with very few defects: (c) it can be easily and efficiently doped with a dopant of p-type or n-type: and (d) when doped with such dopant, there is afforded a desirable high quality p-type or n-type poly-GaP:H(F) semiconductor film having many practically applicable semiconductor characteristics.

The present inventors have further found that in the case of using the foregoing poly-GaP:H(F) film as a member of a pin heterojunction photovoltaic element, there is afforded a pin heterojunction photovoltaic element which efficiently and stably generates a desired photoelectromotive force.

The present invention has been completed on the basis of these findings, and it provides pin heterojunction photovoltaic elements as are below mentioned.

(1) A pin heterojunction photovoltaic element which generates photoelectromotive force by the junction of a p-type semiconductor layer, an i-type semiconductor layer and an n-type semiconductor layer, characterized in that at least one of said p-type and n-type semiconductor layers comprises a polycrystal semiconductor film comprised of gallium atoms (Ga), phosphorus atoms (P), hydrogen atoms (H), optionally fluorine atoms (F), and atoms (M) of a p-type or n-type dopant element: said semiconductor film contains crystal grains of an average size in the range of 50 to 1000 Å: and said semiconductor film contains the hydrogen atoms (H) in an amount of 0.5 to 5 atomic % (this polycrystal semiconductor film will be hereinafter referred to as "poly-GaP: H(F):M film"): and said i-type layer comprises a non-single crystal semiconductor film containing silicon atoms (Si) as a matrix and at least one kind of atoms selected from the group consisting of hydrogen atoms (H) and fluorine atoms (F). Said non-single crystal semiconductor film includes amorphous semiconductor films, microcrystal semiconductor films, and polycrystal semiconductor films, and it will be hereinafter referred to as "Non-Si(H,F) film".

(2) A pin heterojunction photovoltaic element which generates photoelectromotive force by the juction of a p-type semiconductor layer, an i-type semiconductor layer and an n-type semicondeuctor layer, characterized in that at least one of said p-type and n-type semiconductor layers comprises the foregoing poly-GaP:H(F):M semiconductor film: and said i-type semiconductor layer comprises a non-single crystal semiconductor film containing silicon atoms (Si) as a matrix, at least one kind of atoms selected from the group consisting of carbon atoms (C) and germanium atoms (Ge), and at least one kind of atoms selected from the group consisting of hydrogen atoms (H) and fluorine atoms (F) (this film will be hereinafter referred to as "Non-Si(C,Ge)(H,F) semiconductor film"). This Non-Si(C,Ge)(H,F) semiconductor film includes a-Si(C,Ge)(H,F) semiconductor films, uC-Si(C,Ge)(H,F) semiconductor films, and poly-Si(C,Ge)(H,F) semiconductor films.

Any of the foregoing pin heterojunction photovoltaic elements (1) and (2) according to the present invention stably provides a high photoelectric conversion efficiency particularly for short-wavelength light and enables the obtainment of a large Isc at a high Voc. In addition, any of the foregoing pin heterojunction photovoltaic elements (1) and (2) according to the present invention may be a multi-cell tandem stacked photovoltaic element, each cell comprising the foregoing pin heterojunction photovoltaic element (1) or (2). The pin heterojunction photovoltaic element according to the present invention always exhibits its functions even upon repeated use for a long period of time without deterioration and thus, it can be practically used as a power source to supply electric power.

The experiments carried out by the present inventors will be detailed in the following.

EXPERIMENT A

Studies on the method of forming a poly-GaP:H(F) film

The present inventors have prepared a poly-GaP:H(F) film by each of the following three processes (1) to (3).

Process (1) by HR-CVD method

This process (1) is to form a poly-GaP:H(F) film by using a Ga-containing precursor from a Ga-containing raw material gas, a P-containing precursor from a P-containing raw material gas, hydrogen radicals from hydrogen gas ($H_2$), optionally fluorine radicals from a F-containing raw material gas and chemically reacting them in a film-forming space containing a substrate on which a film is to be deposited to form a poly-GaP:H(F) film on the substrate maintained at a desired temperature.

Figure 2:
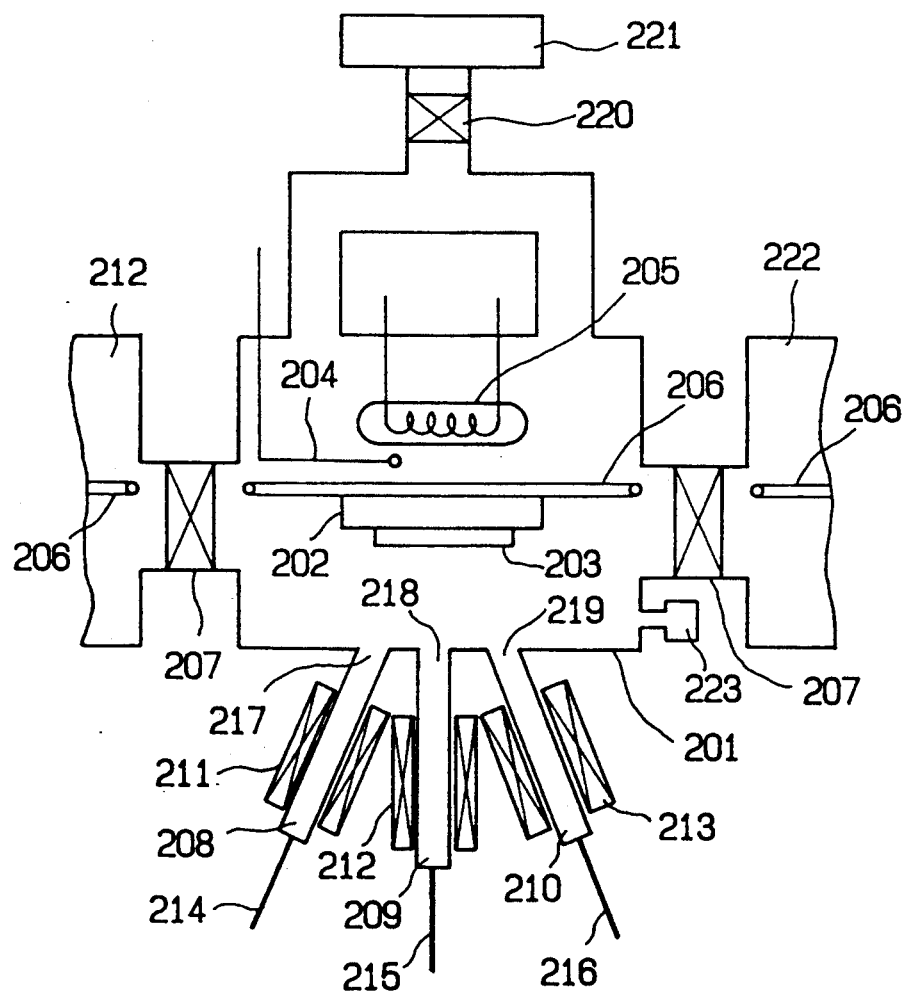
FIG. 2 is a schematic diagram showing the apparatus for forming a deposited film by way of a HR-CVD method of the present invention.

This process (1) is practiced by using an appropriate HR-CVD apparatus having a structure as shown in FIG. 2.

The HR-CVD apparatus shown in FIG. 2 comprises a film-forming chamber 201 in which is installed a substrate holder 202. There is shown a substrate 203 which is fixed onto the substrate holder 202. The substrate 203 is heated by radiation from an infrared heater 205, while being monitored by a thermo-couple 204.

The substrate holder 202 is transferred to the other film-forming chamber 222 or a load lock chamber 212 through a gate valve 207 by a substrate transfer unit 206.

Reference numeral 208 stands for a first activation chamber connected through a transport conduit 217 to the film-forming chamber 201.

To the activation chamber 208, a gas supply pipe 214 extending from a gas reservoir containing, for example, a Ga-containing raw material gas (not shown) is connected. The first activation chamber 208 is provided with an activation energy generation means 211 to apply an activation energy such as an electric energy of direct current, high-frequency or microwave, heat energy or light energy to said Ga-containing raw material gas supplied into the first activation chamber 208, to thereby produce Ga-containing precursors, which are successively transported through the transport conduit 217 into the film-forming chamber 201.

Likewise, numeral reference 209 stands for a second activation chamber connected through a transport conduit 218 to the film-forming chamber 201. To the second activation chamber 209, a gas supply pipe 215 extending from a gas reservoir containing, for example, $H_2$ gas (not shown) is connected.

The second activation chamber 209 is provided with an activation energy generation means 212 to apply an activation energy such as an electric energy of direct current, high-frequency or microwave, heat energy or light energy to said $H_2$ gas supplied into the second activation chamber 209, to thereby produce hydrogen radicals, which are successively transported through the transport conduit 218 into the film-forming chamber 201.

Further, reference numeral 210 stands for a third activation chamber connected through a transport conduit 219 to the film-forming chamber 201. Reference numeral 216 stands for a gas supply pipe extending from a gas reservoir containing, for example, a P-containing raw material gas (not shown) which is connected to the third activation chamber 210. The third activation chamber 210 is provided with an activation energy generation means 213 to apply an activation energy such as an electric energy of direct current, high-frequency or microwave, heat energy or light energy to said P-containing raw material gas supplied into the third activation chamber 210, to thereby produce P-containing precursors, which are successively transported through the transport conduit 219 into the film-forming chamber 201.

The foregoing Ga-containing precursors, P-containing precursors and hydrogen radicals thus introduced into the film-forming chamber 201 are mixed and chemically reacted to form a semiconductor film on the substrate 203 maintained at a desired temperature. The film-forming chamber 201 is provided with an exhaust pipe connected through an exhaust valve 220 to a vacuum pump 221. Reference numeral 223 stands for a pressure gage provided with the film-forming chamber 201, which serves to monitor the inner pressure of the film-forming chamber 201.

Now, by the HR-CVD method practiced in the foregoing HR-CVD apparatus shown in FIG. 2, there were prepared ten kinds of semiconductor films containing Ga and P (Samples Nos. 1 to 10) under the conditions shown in Table 1. In each case, there was used a Corning No. 7059 glass plate of 2 (inch) by 2 (inch) in size and 0.8 mm in thickness (product by Corning Glass Works Co.) as the substrate 203. As for Ga(CH$_3$)$_3$ (raw material gas (A) in Table 1), it was gasified by introducing He gas as a carrier gas thereinto in a bubbling vessel (not shown) and supplied through the gas supply pipe 214 into the first activation chamber 208. PF$_5$ gas (raw material gas B in Table 1) was supplied through the gas supply pipe 216 into the third activation chamber 210. And H$_2$ gas and He gas (raw material gas (C) in Table 1) were supplied through the gas supply pipe 215 into the second activation chamber 209.

For each of the resultant semiconductor film samples Nos. 1 to 10, the film sample was cut into six equal parts.

The first cut part was subject to measurement of the hydrogen content in the film by a SIMS apparatus (trade name: IMS-3f, product by CAMEA Co., Ltd.). The second cut part was set to a X-ray microanalyzer EPM-810Q (product by Shimazu Seisakusho K.K.) to determine the distributed states and the composition ratio of Ga to P in the film. The third cut part was supplied to an X-ray diffractometer RAD IIB (product by Rigaku Denki K.K.) to determine the crystal orientation and the size of the crystal grains in the film.

The results obtained are collectively shown in Table 2.

From the results shown in Table 2, there have been obtained the following findings. That is, it has been firstly recognized that the hydrogen content, the fluorine content and the sizes of crystal grains in the film can be properly controlled by regulating the flow rate of H$_2$ gas to be introduced into the second activation chamber 209.

Then, in the case of each of the film samples Nos. 1 and 2 which were prepared with the respective flow rates of 0 sccm and 0.2 sccm for the H$_2$ gas, it has been found that since supply of the hydrogen radicals into the reaction system is zero or small, the hydrogen content in the film is zero or small but the fluorine content therein is relatively large, the Ga and the P are distributed in localized states and the film structure is random and does not have a crystal orientation.

As for the film samples Nos. 3 to 7, it has been found that the composition ratio of Ga to P in the film satisfies the stoichiometric ratio with the flow rate of H$_2$ gas being increased wherein a crystal orientation is caused and the sizes of crystal grains are enlarged accordingly.

As for the film samples Nos. 8 to 10 which were prepared with an increased flow rate of the H$_2$ gas, a tendency has been found that supply of hydrogen radicals into the reaction system becomes excessive and causes negative influences for the film to be deposited such as etching and because of this, the size of the crystal grains is reduced and the hydrogen content is also reduced.

In consequence, it has been recognize that the amount of hydrogen radical to be supplied into the reaction system plays an important role upon forming the film.

In addition to the above, other facts have also found through further experiments by the present inventors. That is, changes in the film-forming parameters i.e. the substrate temperature, the inner pressure, the activation energy power (microwave power) to be applied, the flow rate of a dilution gas (He gas), the distance between the substrate and the outlet of the transport conduit, the kinds of the raw material gases to be used also contribute somewhat to control of the hydrogen content, the fluorine content and the sizes of crystal grains in the film.

Process (2) by reactive sputtering method

This process (2) forms a poly-GaP:H(F) film by introducing Ar gas and H$_2$ gas, and optionally F$_2$ gas or HF gas in combination into a film-forming chamber in which a substrate is placed and a cathode electrode having a target comprising a single crystal or polycrystal Ga wafer plate or other single crystal or polycrystal GaP wafer plate dosed with hydrogen atoms (H) or-/and fluorine atoms (F) by ion implantation thereon is placed at a position opposite to the substrate, applying a high frequency voltage to the cathode to form a plasma atmosphere in the space between the substrate and the GaP wafer plate, sputtering the GaP wafer plate with the plasma to release gallium atoms (Ga) and phosphorus atoms (P) and chemically reacting the gallium atoms (Ga), phosphorus atoms (P) and hydrogen atoms (H), and optionally fluorine atoms (F) present in the plasma to cause the formation of said film on the substrate maintained at a desired temperature.

Figure 3:
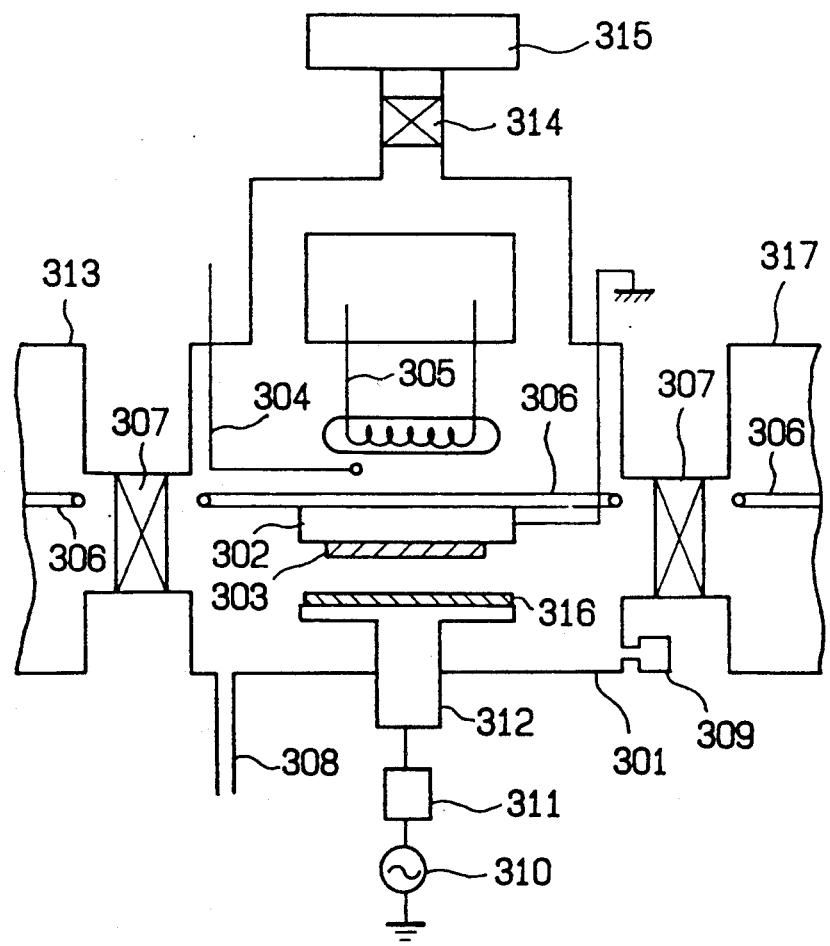
FIG. 3 is a schematic diagram showing the apparatus for forming a deposited film by way of a reactive sputtering method of the present invention.

Process (2) is practiced by using an appropriate reactive sputtering apparatus having a structure as shown in FIG. 3.

The reactive sputtering apparatus shown in FIG. 3 comprises a film-forming chamber 301 in which is installed a substrate holder 302. There is shown a substrate 303 which is fixed onto the substrate holder 302. The substrate 303 is heated by radiation from an infrared heater 305, while being monitored by a thermo-couple 304. The substrate holder 302 is transferred to the other film-forming chamber 317 or a load lock chamber 313 through a gate valve 307 by a substrate transfer unit 306. The substrate 303 is electrically grounded through the substrate holder 302 as shown in FIG. 3. Reference numeral 312 stands for a cathode electrode having a target 316 comprising, for example, a single crystal or polycrystal GaP wafer plate, placed thereon. The cathode electrode 312 is connected through a matching box 311 to a high frequency power source 310. The film-forming chamber 301 is provided with a gas supply pipe 308 for introducing sputtering gases such as Ar gas, H$_2$ gas, F$_2$ gas, etc. into the film-forming chamber. The film-forming chamber 301 is further provided with an exhaust pipe connected through a exhaust valve 314 to a vacuum pump 315. Reference numeral 309 stands for a pressure gage provided with the film-forming chamber 301, which serves to monitor the inner pressure of the film-forming chamber 301.

Now, by the reactive sputtering method practiced in the foregoing sputtering apparatus shown in FIG. 3, there were prepared ten kinds of semiconductor films containing Ga and P (Samples Nos. 11 to 20) under the conditions shown in Table 3.

In each case, there was used a Corning No. 7059 glass plate of 2 (inch) by 2 (inch) in size and 0.8 mm in thickness as the substrate 303.

For each of the resultant film samples Nos. 11 to 20, the film sample was cut into six equal parts, three of them were subjected to the evaluations in the same manners as in the above case.

The results obtained are collectively shown in Table 4.

From the results shown in Table 4, there have been obtained the following findings. That is, it has been firstly recognized that the hydrogen content, the fluorine content and the sizes of crystal grains in the film can be properly controlled by regulating the flow rate of H$_2$ gas or/and HF gas introduced into the film-forming chamber 301.

Then, for the case of the film sample No. 11 which was prepared with introduction of neither H$_2$ gas nor HF gas, it has been recognized that neither hydrogen radical nor fluorine radicals are present in the plasma atmosphere formed in the film-forming chamber 301 and because of this, the resultant film contains neither hydrogen atoms nor fluorine atoms, the composition ratio of Ga to P does not satisfy the stoichiometric ratio and the Ga and the P are distributed in relatively localized states in the film, and the film structure is random and does not have a crystal orientation.

Likewise, in the case of the film sample No. 12 which was prepared with introduction of $H_2$ gas and HF gas respectively at a flow rate of 1 sccm, it has been recognized that hydrogen radicals and fluorine radicals are not present in sufficient amounts in the plasma atmosphere formed in the film-forming chamber 301 and because of this, although the resultant film contains a certain amount of hydrogen atoms, the composition ratio of the Ga to the P does not satisfy the stoichiometric ratio and the Ga and the P are distributed in relatively localized states in the film, and the average size of crystal grains is undesirably small.

On the other hand, for the film samples Nos. 13 to 18, it has been recognized that the more at least the flow rate of $H_2$ gas increases, the more the composition ratio of the Ga to the P satisfies the stoichiometric ratio and the distributed states of the Ga and the P are improved, and in addition, the average size of crystal grains is desirably enlarged and the film contains desired amounts of hydrogen atoms and optional fluorine atoms.

However, for the film samples Nos. 19 and 20 which were prepared with excessive flow rates of $H_2$ gas and HF gas, a tendency has been recognized that excessive amounts of hydrogen radicals and fluorine radicals are present in the plasma atmosphere formed in the film-forming chamber 301 and because of this, the average size of crystal grains is undesirably reduced, and both the hydrogen content and the fluorine content are undesirably increased.

In consequence, it has been recognized that the amount of hydrogen radicals present in the plasma atmosphere formed in the reaction system plays an important role and the chemical reactions to cause the formation of the film are enhanced when fluorine radicals are present together with hydrogen radicals in the above plasma atmosphere formed in the reaction system, thereby resulting in forming desired poly-GaP:H(F) films.

In addition to the above, other facts have been also found through further experiments by the present inventors. That is, changes in the film-forming parameters i.e. the substrate temperature, the inner pressure, the high frequency power to be applied, the flow rates of sputtering gases to be used, the distance between the target and the substrate and the like also contribute somewhat to control of the hydrogen content, the fluorine content and the average size of crystal grains in the film.

Process (3) by plasma CVD method

This process (3) forms a poly-GaP:H(F) film by introducing a Ga-containing raw material gas (A), a P-containing raw material gas (B) and $H_2$ gas (C), and optionally a further gas such as HF gas or $F_2$ gas into a film-forming chamber in which a substrate on which a film is to be formed is placed and a cathode electrode is installed, applying a high frequency voltage to the cathode to cause glow discharge plasmas by which the raw material gases are decomposed to cause the formation of said film on the substrate maintained at a desired temperature.

Figure 4:
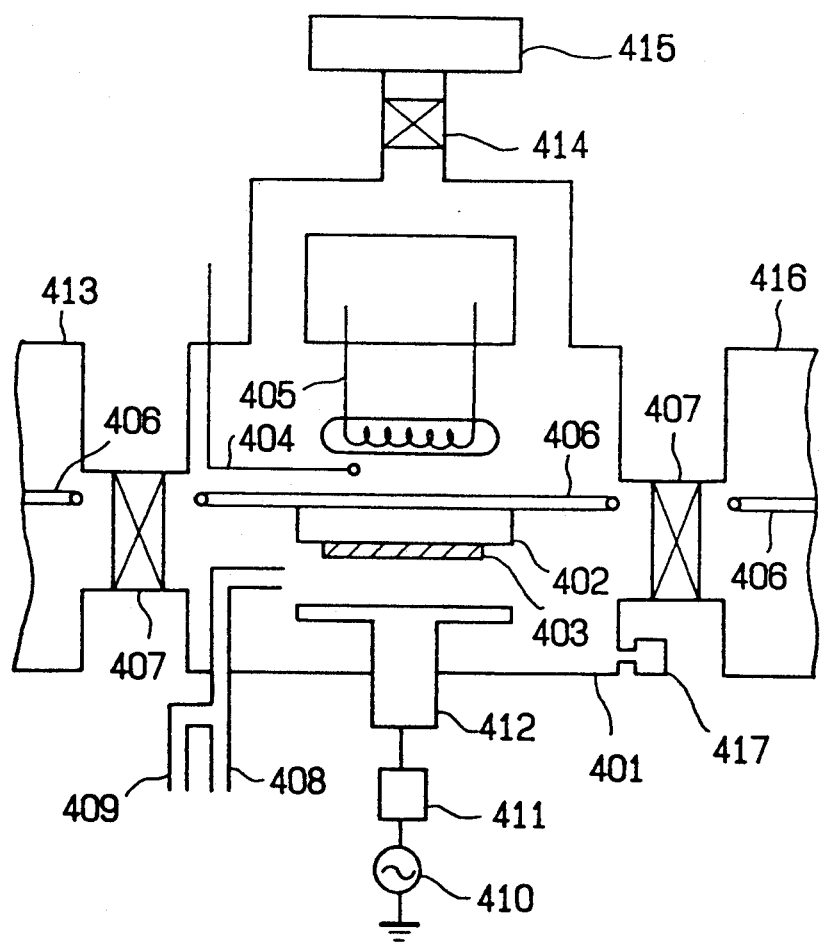
FIG. 4 is a schematic diagram showing the apparatus for forming a deposited film by way of a plasma CVD method of the present invention.

This process (3) is practiced by using an appropriate plasma CVD apparatus having a structure as shown in FIG. 4.

The plasma CVD apparatus shown in FIG. 4 comprises a film-forming chamber 401 in which is installed a substrate holder 402. There is shown a substrate 403 which is fixed onto the substrate holder 402. The substrate 403 is heated by radiation from an infrared heater 405, while being monitored by a thermo-couple 404. The substrate holder 402 is transferred to the other film-forming chamber 416 or a load lock chamber 413 through a gate valve 407 by a substrate transfer unit 406. Reference numeral 412 stands for a cathode electrode which is placed at the position opposite to the substrate 403. The cathode electrode 412 is connected through a matching box 411 to a high frequency power source 410. The film-forming chamber 401 is provided with a gas supply pipe which is connected through a plurality of feed pipes 408, 409 to a plurality of gas reservoirs (not shown). The film-forming chamber 401 is further provided with an exhaust pipe connected through an exhaust valve 414 to a vacuum pump 415. Reference numeral 417 stands for a pressure gage provided with the film-forming chamber 401, which serves to monitor the inner pressure of the film-forming chamber 401.

Now, by the plasma CVD method practiced in the foregoing plasma CVD apparatus shown in FIG. 4, there were prepared ten kinds of GaP system semiconductor films (Samples Nos. 21 to 30) under the conditions shown in Table 5. In each case, there was used a Corning No. 7059 glass plate of 2 (inch) by 2 (inch) in size and 0.8 mm in thickness as the substrate 403.

As for $Ga(CH_3)_3$ (raw material gas (A) in Table 5), it was gasified by introducing He gas as a carrier gas thereinto in a bubbling vessel (not shown) to produce a raw material gas containing said $Ga(CH_3)_3$, which was supplied into the film-forming chamber 401 through the feed pipe 408. Other raw material gases, i.e. $PH_3$ gas (raw material gas (B) in Table 5), and $H_2$ gas and HF gas (raw material gas (C) in Table 5) were supplied into the film-forming chamber 401 through the feed pipe 409.

For each of the resultant film samples Nos. 21 to 30, the film sample was cut into six equal parts, the three parts of which were subjected to the evaluations in the same manners as in the foregoing case of the process (1).

The results obtained are collectively shown in Table 6.

From the results shown in Table 6, there have been obtained the following findings.

That is, it has been firstly recognized that the hydrogen content, the fluorine content and the average size of crystal grains in the film can be properly controlled by regulating the flow rate of the raw material gas (C) i.e. principally $H_2$ gas and also HF gas introduced into the film-forming chamber 401.

Then, for the case of the film sample No. 21 which was prepared with introduction of neither $H_2$ gas nor HF gas, it has been recognized that because there is used neither the $H_2$ gas nor the HF gas, the resultant film is amorphous, the Ga and the P are distributed in localized states and the film contains an undesirably large amount of hydrogen atoms due to the influence caused by the residual —$CH_3$ group in the reaction system.

Likewise, for the case of the film sample No. 22 which was prepared with introduction of $H_2$ gas only at a flow rate of 5 sccm, it has been recognized that because the amount of hydrogen radicals present in the plasma atmosphere formed in the reaction system is insufficient, the resultant film is amorphous, the Ga and the P are distributed in localized states and the film contains an undesirably large amount of hydrogen atoms due to the influence caused by the residual —$CH_3$ group in the reaction system. Further, for the case of the film sample No. 23 which was prepared by introducing $H_2$ gas and HF gas into the film-forming chamber 401 respective at flow rates of 5 sccm, it has been recognized that because the amount of hydrogen radicals present in the plasma atmosphere formed in the reaction systemis still insufficient, the resultant film is still amorphous and the distributed states of the Ga and the P are not desirably even but uneven.

On the other hand, for the film samples Nos. 24 to 28 which were prepared by introducing $H_2$ gas at respective flow rates of 50, 100, 100, 300 and 500 and HF gas at respective flow rates of 50, 50, 100, 50 and 50 into the film-forming chamber 401, each of the films contains desirable amounts of hydrogen atoms and fluorine atoms, the composition ratio of the Ga to the P satisfies the stoichiometric ratio, the Ga and the P are evenly distributed in the film, the film has a desirable crystal orientation and contains a desirable average size of crystal grains. However, for the film samples Nos. 29 and 30 which were prepared with excessive flow rates of $H_2$ gas, a tendency has been recognized that there is present an excessive amount of hydrogen radicals in the plasma atmosphere formed in the reaction system and because of this, reduction in the average size of crystal grains in the film is caused.

In consequence, it has been recognized that the amount of hydrogen radicals present in the plasma atmosphere upon forming the poly-GaP:H(F) film plays an important role and the chemical reactions to cause the formation of said film are enhanced when fluorine radicals are present together with the hydrogen radicals in the plasma atmosphere formed in the reaction system, thereby resulting in forming a desired poly-GaP:H(F) film.

In addition to the above, other facts have been also found through further experiments by the present inventors. That is, changes in the film-forming parameters i.e. the substrate temperature, the inner pressure, the high frequency power to be applied, the flow rates and the kinds of the raw material gases (A),(B) and (C), the distance between the substrate and cathode, and the like also contribute somewhat to control the hydrogen content, the fluorine content and the average size of crystal grains in the film.

EXPERIMENT B

Observations of the interrelations among various characteristics, the content of hydrogen atoms, the content of optional fluorine atoms, and the average size of crystal grains for the deposited film Each of the foregoing film samples Nos. 1 to 30 was examined for deterioration in its characteristics under light irradiation.

The examination was carried out using one of the remaining cut three parts.

Prior to the examination, a comb-shaped Cr electrode was formed on each specimen by vacuum deposition. The resultant was exposed to AM-1 light (100 mW/cm$^2$) for 8 hours to examine the ratio of change $\Delta\sigma$ in the electric conductivity ($\sigma$) after irradiation with the AM-1 light for 8 hours versus the initial value ($\sigma_i$), that is, $\Delta\sigma = \sigma_e/\sigma_i$, where $\sigma_e$ is the value after irradiation with the AM-1 light for 8 hours.

The results for the ratio of change $\Delta\sigma$ are collectively shown in Table 7. For this evaluation item in Table 7, the symbol "O" means the case where $\Delta\sigma \geq 0.95$, the symbol "Δ" means the case where $0.9 \leq \Delta\sigma < 0.95$ and the symbol "X" means the case where $\Delta\sigma < 0.9$.

Then, each of the foregoing film samples Nos. 1 to 30 was examined for the content of an impurity in the following way. That is, in each case, one of the remaining two cut parts was placed in a cryostat and irradiated with light from a UV lamp (1 KW) at a temperature of 7.7 K. to examine photoluminescence.

This evaluation was made based on the ratio $\Delta I$ between the intensity $I_R$ of a spectrum from the film sample No. 11 as the control and the intensity Is of a spectrum from the other film sample (that is, $\Delta I = I_s/I_R$) and the number of the spectra. The results for the photoluminescence are collectively shown in Table 7. For this evaluation item in Table 7, the symbol "O" means the case where $\Delta I \leq 0.3$, the symbol "Δ" means the case where $0.3 < \Delta I \leq 0.7$, and the symbol "X" means the case where $\Delta I > 0.7$.

Finally, each of the foregoing film samples Nos. 1 to 30 was examined for surface smoothness in the following way. That is, in each case, the remaining last cut part was placed in a FE-SEM (trade name: field-emission scanning electron microscope S-900, produced by Hitachi Seisakusho K.K.) to examine the minute structure of the surface of the film. The results are collectively shown in Table 7.

For this evaluation item in Table 7, the symbol "⊚" means the case where crystal grains are uniformly distributed, and any surface roughness and pin holes are not present, and the symbol "X" means the case where crystal grains are not observed, crystal grains are unevenly distributed, and/or roughness and pin holes are observed.

In addition, the above results were combined to totally evaluate each of the film samples Nos. 1 to 30. The totally evaluated results are collectively shown in the column "total evaluation" of Table 7. For this evaluation in Table 7, the symbol " O " means the case where the total evaluation was concluded to be excellent, the symbol "O" means the case where the total evaluation was concluded to be good, the symbol "Δ" means the case where the total evaluation was concluded to be fairly good, and the symbol "X" means the case where the total evaluation was concluded to be not good.

From the results shown in Table 7, it has been considered that the film samples which were evaluated as being excellent or good in the total evaluation are desirably usable as constituent element members in various electronic devices including photovoltaic devices. And it has been confirmed that each of these film samples contains hydrogen atoms in an amount of 0.5 to 5 atomic %, optional fluorine atoms in an amount of 0 to 3 atomic %, and crystal grains of an average size in the range of 50 to 1000 Å.

EXPERIMENT C

Observations of the doping properties of the GaP:H(F) film

(1) n-type doping properties

The foregoing procedures for preparing the film samples No. 1 to 10 by the HR-CVD method were repeated, except that liquid $Se(CH_3)_2$ was gasified by feeding He gas (as a carrier gas) into said liquid $Se(CH_3)_2$ in a babbling vessel (not shown) to generate a gas comprising $Se(CH_3)_2$ saturated with He gas (hereinafter referred to as "$Se(CH_3)_2$/He gas") and this $Se(CH_3)_2$/He gas was additionally used as an n-type dopant-imparting raw material gas together with the raw material gas (A) in Table 1 and said $Se(CH_3)_2$/He gas was introduced into the first activation chamber 208 at a flow rate of $2\times10^{-10}$ mol/min together with the raw material gas (A), to thereby obtain ten GaP:H(F):Se film samples (Samples Nos. 31 to 40).

Likewise, ten GaP:H(F):Se film samples (Samples Nos. 41 to 50) were prepared by repeating the foregoing procedures for preparing the film samples Nos. 11 to 20 by the reactive sputtering method, except for using said $Se(CH_3)_2$/He gas in addition to the sputtering gases shown in Table 3 and introducing said $Se(CH_3)_2$/He gas at a flow rate of $5\times10^{-11}$ mol/min together with the sputtering gases into the film-forming chamber 301.

Further, ten GaP:H(F): Se film samples (Samples Nos. 51 to 60) were prepared by repeating the foregoing procedures for preparing the film samples 21 to 30 by the plasma CVD method, except for using said $Se(CH_3)_2$/He gas in addition to the raw material gas (A) shown in Table 5 and introducing said $Se(CH_3)_2$/He gas at a flow rate of $1\times10^{-10}$ mol/min together with the raw material gas (A) into the film-forming chamber 401.

Each of the film samples Nos. 31 to 60 thus obtained was examined with respect to various evaluation items in the same manners as in the above Experiments A and B. Each was also examined for conduction type by a conventional thermo-electric power measuring method.

As a result, the film samples Nos. 34 to 38 (which correspond to the foregoing film samples Nos. 4 to 8), the film samples Nos. 43 to 48 (which correspond to the foregoing film samples Nos. 13 to 18), and the film samples Nos. 55 to 58 (which correspond to the foregoing film samples Nos. 25 to 28) were found to be excellent or good in the total evaluation. Specifically, each of these film samples was very satisfactory, with the hydrogen content in the range of 0.5 to 5 atomic %, the fluorine content in the range of 0 to 3 atomic %, the average size of crystal grains, the ratio of change in the electric conductivity and the photoluminescence, and it had a desirable crystal orientation. And each of these film samples exhibited a desirable n-type conductivity.

The average size of crystal grains contained in these film samples was found to be in the range of 50 to 1000 Å. Separately, as a result of examining the quality of each of these film samples doped with an n-type dopant (Se), it has been found that each of the film samples containing fluorine atoms (F) exhibits an improved heat resistance.

(2) p-type doping properties

The foregoing procedures for preparing the film samples Nos. 1 to 10 by the HR-CVD method were repeated, except that there was used $Zn(CH_3)_2$ (hereinafter referred to as "DMZn") as a p-type dopant-imparting raw material gas. It was gasified by introducing He gas as a carrier gas into the DMZn contained in a bubbling vessel (not shown) and the resultant gas was introduced at a flow rate of $4\times10^{-10}$ mol/min into the activation chamber 208 together with the raw material gas (A) in Table 1, to thereby obtain ten GaP:H(F):Zn film samples (Samples Nos. 61 to 70).

Likewise, ten GaP:H(F):Zn film samples (Samples Nos. 71 to 80) were prepared by repeating the foregoing procedures for preparing the film samples Nos. 11 to 20 by the reactive sputtering method, except for using DMZn, gasifying it with the use of He gas and introducing the resultant gas containing DMZn at a flow rate of $6.5\times10^{-11}$ mol/min into the film-forming chamber 301 together with the sputtering gases shown in Table 3.

Further, ten GaP:H(F):Zn film samples (Sample Nos. 81 to 90) were prepared by repeating the foregoing procedures for preparing the film samples Nos. 21 to 30 by the plasma CVD method, except for using DMZn, gasifying it with the use of He gas and introducing the resultant gas containing DMZn at a flow rate of $2\times10^{-10}$ mol/min into the film-forming chamber 401 together with the raw material gas (A) shown in Table 5.

Each of the film samples Nos. 61 to 90 thus obtained was examined with respect to various evaluation items in the same manners as in the above Experiments A and B. It was also examined for conduction type by a conventional thermo-eletric power measuring method.

As a result, the film samples No. 64 to 68 (which correspond to the foregoing film samples Nos. 4 to 8), the film samples Nos. 73 to 78 (which correspond to the foregoing film samples Nos. 13 to 18), and the film samples Nos. 85 to 88 (which correspond to the foregoing film samples Nos. 25 to 8) were found to be excellent or good in the total evaluation. Specifically, each of these film samples was very satisfactory, with the hydrogen content in the range of 0.5 to 5 atomic %, the fluorine content in the range of 0 to 3 atomic %, the average size of crystal grains, the ratio of change in the electric conductivity and the photoluminescence, and it had a desirable crystal orientation. Each of these film samples exhibited a desirable p-type conductivity. The average size of crystal grains contained in any of these film samples was found to be in the range of 50 to 1000 Å. Separately, as a result of examining the quality of each of these film samples doped with a p-type dopant (Zn), it has been found that each of the film samples containing fluorine atoms (F) exhibits an improved heat resistance.

Not only from the above results obtained through the above experiments but also from the results obtained through further studies, it has been recognized that a desirable poly-GaP:H(F):M semiconductor film (where M is a dopant of n-type or p-type) in which the Ga and the P are evenly distributed and the composition ratio of the Al to the P satisfies the stoichiometric ratio and which contains crystal grains of a desired average size and has a desired crystal orientation can be effectively obtained by the foregoing HR-CVD method, reactive sputtering method or plasma CVD method in which the amount of hydrogen radicals present in the plasma atmosphere formed in the reaction system is properly controlled. And in the case where fluorine radicals are present together with hydrogen radicals in the plasma atmosphere, the chemical reactions causing the formation of said semiconductor film are further enhanced. Further, the presence of hydrogen radicals in a controlled amount in the plasma atmosphere formed in the reaction system causes significant effects such as promoting the chemical reactions causing the formation of said semiconductor film without localization of atoms of the constituent elements of the film from the raw material gases and to incorporating a desired amount of hydrogen atoms into the film to be formed so that the resulting film has practically applicable desired characteristics. This situation is improved in the case where fluorine radicals are present together with hydrogen radicals in the plasma atmosphere formed in the reaction system.

It has been found that in the case of a GaP film which contains neither hydrogen atoms nor fluorine atoms or contains hydrogen atoms in a slight amount or contains both hydrogen atoms and fluorine atoms only in slight amounts, when it is irradiated with light of a strong intensity for a long period of time, changes in the film structure or in the film composition due to promotion of by-reactions caused by external factors such as dissociation or hydrolysis of the unstable bonds in the film, an increase in the dangling bonds in the film caused by release of hydrogen atoms and/or fluorine atoms often occurs, thereby causing deterioration in the initial film structure. However, in the case of the poly-GaP:H(F):M semiconductor film according to the present invention which contains hydrogen atoms in an amount of 0.5 to 5 atomic % and optionally fluorine atoms in an amount of 0 to 3 atomic %, it has been confirmed that these atoms terminate dangling bonds when they are present in the crystal grains and also terminate dangling bonds when they are present at the grain boundaries and thus the film is accompanied with an extremely reduced crystal defect level, excellent structural stress relaxation and excellent electrical, optical and mechanical properties. Thus, the poly-GaP:H(F):M semiconductor film according to the present invention can be desirably used as a constituent element in various electronic devices including photovoltaic devices.

The n-type poly-GaP:H(F):Mn semiconductor film (where Mn is an n-type dopant) according to the present invention contains an n-type dopant (represented by Mn) which is selected from the group consisting of Group VI A elements, i.e. O, S, Se and Te. Preferable among these elements are Se and Te.

The p-type poly-GaP:H(F):$M_p$ semiconductor film (where Mp is a p-type dopant) according to the present invention contains a p-type dopant (represented by $M_p$) which is selected from the group consisting of Group II B elements i.e. Zn, Cd and Hg. Preferable among these elements are Zn and Cd.

As the starting material to impart the n-type dopant to be used in order to obtain the poly-GaP:H(F):Mn semiconductor film, there can be mentioned, for example, NO, $N_2O$, $CO_2$, CO, $H_2S$, $SCl_2$, $S_2Cl_2$, $SOCl_2$, $SO_2Cl_2$, $SeCl_4$, $Se_2Cl_2$, $Se_2Br_2$, $SeOCl_2$, $Se(CH_3)_2$, $Se(C_2H_5)_2$, $TeCl_2$, $Te(CH_3)_2$ and $Te(C_2H_5)_2$.

These compounds can be used alone or in combination of two or more of them. In the case where the compound is in the liquid state at ordinary temperatures and at atmospheric pressure, it is desired that the compound is gasified by feeding an inert gas such as Ar gas or He gas into the liquid compound contained in a bubbling vessel while heating and the gas generated is introduced into the film-forming chamber. In the case where the compound is in the solid state at ordinary temperatures and at atmospheric pressure, it is desired that the compound is gasified by passing an inert gas such as Ar gas or He gas over the solid compound contained in a heat sublimation furnace while heating and the gas generated is introduced into the film-forming chamber.

As the starting material to impart the p-type dopant to be used in order to obtain the poly-GaP:H(F):$M_p$ semiconductor film, there can be mentioned, for example, $Zn(CH_3)_2$, $Zn(C_2H_5)_2$, $Zn(OCH_3)_2$, $Zn(OC_2H_5)_2$, $Cd(CH_3)_2$, $Cd(C_2H_5)_2$, $Cd(C_3H_7)_2$, $Cd(C_4H_9)_2$, $Hg(CH_3)_2$, $Hg(C_2H_5)_2$, $Hg(C_6H_5)_2$ and $Hg[C\equiv(C_6H_5)]_2$.

These compounds can be used alone or in combination of two or more of them. In the case where the compound is in the liquid state at ordinary temperatures and at atmospheric pressure, it is desired that the compound is gasified by feeding an inert gas such as Ar gas or He gas into the liquid compound contained in a bubbling vessel while heating and the gas generated is introduced into the film-forming chamber.

In the case where the compound is in the solid state at ordinary temperatures and at atmospheric pressure, it is desired that the compound is gasified by passing an inert gas such as Ar gas or He gas over the solid compound contained in a heat sublimation furnace while heating and the gas generated is introduced into the film-forming chamber.

Alternatively, the poly-GaP:H(F):Mn semiconductor film or the poly-GaP:H(F):Mp semiconductor film according to the present invention may be obtained by substituting part of the gallium atoms (Ga) or part of the phosphorous atoms (P) of a poly-GaP:H(F) semiconductor film by an element belonging to Group IV A of the Periodic Table. Specific examples of such elements are C, Si, Ge, Sn and Pb. Preferable among these elements are Si, Ge and Sn. That is, in the case where part of the gallium atoms (Ga) of the poly-GaP:H(F) semiconductor film is substituted by said element, there is afforded an n-type poly-GaP:H(F) semiconductor film. In the case where part of the phosphorous atoms (P) of the poly-GaP:H(F) semiconductor film is substituted by said element, there is afforded a p-type poly-GaP:H(F) semiconductor film. It is possible to substitute both part of the gallium atoms and part of the phosphorous atoms by said element. In this case, when both parts are equally substituted by said element, the resulting semiconductor film sometimes becomes intrinsic. When both parts are substituted by said element, the resulting film will be of n-type or p-type depending upon which atoms are excessively substituted by said element.

Specific examples of starting materials to impart C are $CH_4$, $C_2H_6$, $C_2H_4$, $C_2H_2$, $C_2H_8$, $C_3H_6$, $C_3H_4$, $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CH_2Cl_2$, $CHI_3$, $CH_2I_2$, $C_2Cl_3F_3$, $C_2H_3F_3$ and $C_2H_2F_4$.

Specific examples of starting materials to impart Si are $SiH_4$, $Si_2H_6$, $Si_3H_8$, $(SiH_2)_4$, $(SiH_2)_5$, $(SiH_2)_6$, $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiH_2Cl_2$, $SiHBr_3$, $SiHI_3$, $Si_2Cl_3F_3$, $Si_2H_3F_2)_5$, $(GeF_2)_6$, $(GeF_2)_4$, $Ge_2F_6$, $Ge_3F_8$, $GeHF_3$, $GeH_2F_2$, $GeCl_4$, $(GeCl_2)_5$, $GeBr_4$, $(GeBr_2)_5$, $Ge_2Cl_6$, $Ge_2Br_6$, $GeHCl_3$, $GeH_2Cl_2$, $GeHBr_3$, $GeHI_3$, $Ge_2Cl_3F_3$, $Ge_2H_3F_3$, $Ge_2H_3Cl_3$, $Ge_2H_2F_4$ and $Ge_2H_2Cl_4$.

Specific examples of starting materials to impart Sn are $SnH_4$, $SnCl_4$, $SnBr_4$, $Sn(CH_3)_4$, $Sn(C_2H_5)_4$, $Sn(C_3H_7)_4$, $Sn(C_4H_9)_4$, $Sn(OCH_3)_4$, $Sn(OC_2H_5)_4$, $Sn(i-OC_3H_7)_4$ and $Sn(tOC_4H_9)_4$.

Specific examples of starting materials to impart Pb are $Pb(CH_3)_4$, $Pb(C_2H_5)_4$ and $Pb(C_4H_9)_4$.

As for these compounds, a single compound is generally used. But two or more compounds can be used together where necessary.

In the case where the compound to be used is in the gaseous state at ordinary temperatures and at atmospheric pressure, it is introduced into the activation space or the film-forming chamber while controlling its flow rate to a desired value, for example, by means of a mass flow controller. In the case where the compound to be used is in the liquid state at ordinary temperatures and at atmospheric pressure, it is desired that the liquid compound is gasified by feeding an inert gas such as Ar gas or He gas into it contained in a bubbling vessel while heating and the gas generated is introduced into the activation chamber or the film-forming chamber while controlling its flow rate to a desired value. In the case where the compound to be used is in the solid state at ordinary temperatures and at atmospheric pressure, it is desired that the solid compound is gasified by passing an inert gas such as Ar gas or He gas over it contained in a heat sublimation furnace while heating and the gas generated is introduced into the activation chamber or the film-forming chamber while controlling its flow rate to a desired value.

As the Ga-containing raw material to be used in any of the foregoing processes (1) to (3) in the present invention, there can be mentioned, for example, $Ga(CH_3)_3$, $Ga(C_2H_5)_3$, $Ga(OCH_3)_3$, $Ga(C_2H_5)_3$, $Ga(O_3H_7)_3$, $GaCl_3$, $GaBr_3$, $GaI_3$, etc.

As for these Ga-containing raw materials, they can be used alone or in combination of two or more of them.

In the case where the compound to be used is in the gaseous state at ordinary temperatures and at atmospheric pressure, it is introduced into the activation space or the film-forming chamber while controlling its flow rate to a desired value, for example, by means of a mass flow controller. In the case where the compound to be used is in the liquid state at ordinary temperatures and at atmospheric pressure, it is desired that the liquid compound is gasified by feeding an inert gas such as Ar gas or He gas into it contained in a bubbling vessel while heating and the gas generated is introduced into the activation chamber or the film-forming chamber while controlling its flow rate to a desired value. In the case where the compound to be used is in the solid state of ordinary temperatures and at atmospheric pressure, it is desired that the solid compound is gasified by passing an inert gas such as Ar gas or He gas over it contained in a heat sublimation furnace while heating and the gas' generated is introduced into the activation chamber or the film-forming chamber while controlling its flow rate to a desired value.

As the P-containing raw materials to be used in the present invention, there can be mentioned, for example, $PH_3$, $P_2H_4$, $PF_3$, $PF_5$, $PCl_3$, $PCl_5$, $PBr_3$, $PBr_5$, $P(CH_3)_3$, $P(C_2H_5)_3$, $P(C_3H_7)_3$, $P(C_4H_9)_3$, $P(OCH_3)_3$, $P(OC_2H_5)_3$, $P(OC_3H_7)_3$, $P(OC_4H_9)_3$, $P_2O_5$, $POCl_3$, $PO(OCH_3)_3$, $PO(OC_2H_5)_3$, $PO(OC_3H_7)_3$, $PO(OC_4H_9)_3$, etc.

As for these P-containing raw materials, they can be used alone or in combination of two or more of them.

In the case where the compound to be used is in the gaseous state at ordinary temperatures and at atmospheric pressure, it is introduced into the activation space or the film-forming chamber while controlling its flow rate to a desired value, for example, by means of a mass flow controller. In the case where the compound to be used is in the liquid state at ordinary temperatures and at atmospheric pressure, it is desired that the liquid compound is gasified by feeding an inert gas such as Ar gas or He gas into it contained in a bubbling vessel while heating and the gas generated is introduced into the activation chamber or the film-forming chamber while controlling its flow rate to a desired value. In the case where the compound to be used is in the solid state at ordinary temperatures and at atmospheric pressure, it is desired that the solid compound is gasified by passing an inert gas such as Ar gas or He gas over it contained in a heat sublimation furnace while heating and the gas generated is introduced into the activation chamber or the film-forming chamber while controlling its flow rate to a desired value.

The substrate temperature during forming the foregoing poly-GaP:H(F):M semiconductor film (where M is a dopant of n-type or n-type) by any of the foregoing processes (1) to (3) is desired to be controlled to a temperature preferably in the range of from 50° to 600° C., more preferably in the range of from 50° to 450° C., most preferably in the range of from 100° to 400° C.

The inner pressure of the film-forming chamber during forming said poly-GaP:H(F):M semiconductor film by the foregoing process (1) or the foregoing process (3) is desired to be controlled to a value preferably in the range of from $1 \times 10^{-4}$ to 50 Torr, more preferably in the range of from $5 \times 10^{-3}$ to 10 Torr, or most preferably in the range of from $1 \times 10^{-3}$ to 5 Torr. As for the inner pressure of the film-forming chamber during forming said poly-GaP:H(F):M semiconductor film by the foregoing process (2), it is desired to be controlled to a value preferably in the range of from $1 \times 10^{-5}$ to $1 \times 10^{-1}$ Torr, more preferably in the range of from $1 \times 10^{-4}$ to $1 \times 10^{-2}$ Torr.

In the following, explanation will be given concerning the structure of the photovoltaic element according to the present invention.

When a pin heterojunction photovoltaic element is so designed that the p-type semiconductor layer is made thin so as to impinge light from the side thereof, it can be theoretically expected that the light will be slightly absorbed in the p-type semiconductor layer but mostly absorbed in the i-type semiconductor layer to thereby obtain a desirable current.

However, in practice, there is a limit to how thin the p-type semiconductor layer can be not only because of the physical and electrical properties but also because of the film-forming technique. In view of this, it is commonly required to have a thickness of some tens of angstroms to some hundreds of angstroms and due consideration should be made for its band gap in order to prevent the light impinged from being absorbed by the p-type semiconductor layer.

In the case where the i-type semiconductor layer is formed of an a-Si:H film or an a-SiC:H film which is capable of absorbing relatively short wavelength light and generating photocarriers, absorption of the light by the p-type semiconductor layer is reduced to provide a marked improvement in the current to be outputted. Because of this, it is necessary for the p-type semiconductor layer to be formed of a semiconductor film having a wide band gap.

In the case of a pin heterojunction photovoltaic element, when its p-type semiconductor layer or/and its n-type semiconductor layer is formed of a semiconductor film having a wide band gap, it generates a high open-circuit voltage (Voc) and exhibits a high photoelectric conversion efficiency.

Thus, as above described, the poly-GaP:H(F):M semiconductor film (where M is a dopant of n-type or p-type) according to the present invention is indeed a desirable semiconductor film of p-type or n-type which can be effectively used as the p-type semiconductor layer or n-type layer of the pin heterojunction photovoltaic element since said semiconductor film contains gallium atoms (Ga) and phosphorous atoms (P) uniformly distributed while satisfying the stoichiometric ratio, hydrogen atoms (H) in a specific amount and optionally fluorine atoms (F) in a specific amount, further contains crystal grains of a desired average size, has a desired crystal orientation, is accompanied with very few defects, has a desirably wide band gap and exhibits markedly improved characteristics and thus, it surpasses the known GaP semiconductor film.

What has been stated above for the p-type semiconductor layer through which light is impinged is applicable in the case where light is impinged from the side of the n-type semiconductor layer. Further, in the case of a multi-cell tandem stacked type or triple type pin heterojunction photovoltaic element each cell comprising a pin heterojunction photovoltaic element, when the p-type or n-type semiconductor layer of the cell situated on the side from which light is impinged is formed of the foregoing poly-GaP:H(F):M film, marked effects are also provided.

In addition, the poly-GaP:H(F):M semiconductor film according to the present invention is capable of also absorbing relatively long wavelength light. Because of this, even in the case where the i-type semiconductor layer is formed of a-SiGe:H film or uC-Si:H film having a narrow band gap which makes it possible to obtain a large photocurrent, as long as the p-type semiconductor layer through which light is impinged is formed of the poly-GaP:H(F):Mp semiconductor film having a wide band gap (where Mp is a p-type dopant) according to the present invention, there is desirably caused a so-called back-surface field effect due to a gap of the conduction band between the p-type semiconductor layer and the i-type semiconductor layer to thereby prevent electrons generated in the i-type semiconductor layer from being back-diffused at the interface between the p-type semiconductor layer and the i-type semiconductor layer, whereby providing a significant improvement in the photocurrent to be obtained.

Thus, for to the pin heterojunction photovoltaic element, a large photocurrent is afforded and a markedly improved photoelectric conversion efficiency is provided. In fact, the pin heterojunction photovoltaic element according to the present invention stably provides an excellent photoelectric conversion efficiency not only for a light source having a relatively large quantity of short wavelength components such as a fluorescent lamp but also for a light source having a large quantity of long wavelength components such as an incandescent lamp. In view of this, the pin heterojunction photovoltaic element according to the present invention can be desirably used also as a power source in various electric appliances.

Further, the tandem stacked type pin heterojunction photovoltaic element and the triple type pin heterojunction photovoltaic element according to the present invention provide excellent photoelectric conversion efficiency, excellent durability and stably exhibit their functions without being deteriorated even upon repeated use for a long period of time and they can be desirably used as solar cells in power supply systems by sunlight power generation.

The following describes typical examples of the pin heterojunction photovoltaic element to be provided according to the present invention.

The following description, however, is not intended to limit the scope of the present invention.

Figure 1B:
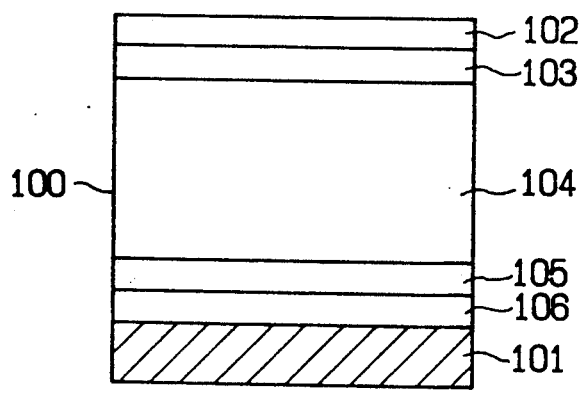
FIG. 1(B) is a schematic representation showing another typical layer structure of the pin heterojunction photovoltaic element according to the present invention.

FIG. 1(A) and FIG. 1(B) schematically show typical embodiments of the pin heterojunction photovoltaic element according to the present invention which has a layer structure based on the foregoing poly-GaP:H(F):M semiconductor film.

FIG. 1(A) is a schematic cross-sectional view of a first representative embodiment of the pin heterojunction photovoltaic element according to the present invention. In FIG. 1(A), there is shown a pin heterojunction photovoltaic element 100 having a structure comprising a lower electrode 102, an n-type semiconductor layer 103, an i-type semiconductor layer 104, a p-type semiconductor layer 105, a transparent electrode 106 and a collecting electrode 107 disposed in this order on a substrate 101.

In the pin heterojunction photovoltaic element shown in FIG. 1(A), light is impinged from the side of the transparent electrode 106.

FIG. 1(B) is a schematic cross-sectional view of a second representative embodiment of the pin heterojunction photovoltaic element according to the present invention.

In FIG. 1(B), there is shown a pin heterojunction photovoltaic element 100 comprising a transparent electrode 106, a p-type semiconductor layer 105, an i-type semiconductor layer 104, an n-type semiconductor layer 103 and a lower electrode 102 disposed in this order on a stransmissive substrate 101. In the pin heterojunction photovoltaic element shown in FIG. 1(B), light is impinged from the side of the transmissive substrate 101.

For each of the above pin heterojunction photovoltaic elements shown in FIG. 1(A) and FIG. 1(B), it is possible to transpose each of the n-type semiconductor layer and the p-type semiconductor layer in accordance with the desired use requirements.

Figure 1C:
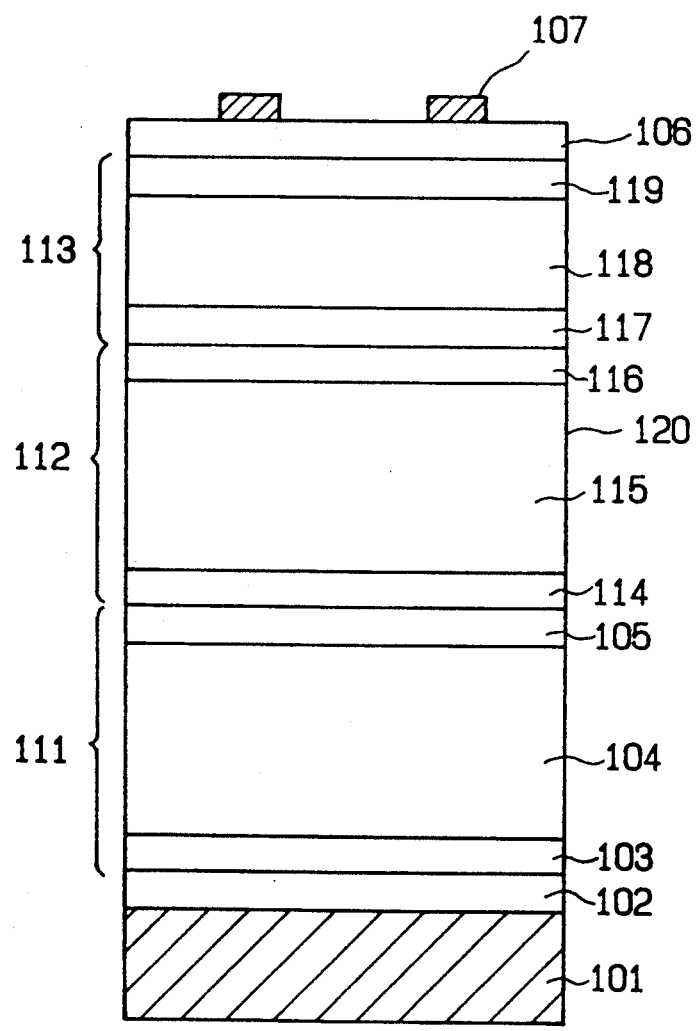
FIG. 1(C) is a schematic representation showing a typical multi-cell tandem stacked structure of the pin heterojunction photovoltaic element according to the present invention.

FIG. 1(C) is a schematic cross-sectional view of a representative embodiment of the triple cell tandem stacked type pin heterojunction photovoltaic element 120 according to the present invention which comprises three cells 111, 112 and 113 stacked on a lower electrode 102 disposed on a substrate 101, each cell comprising a pin heterojunction photovoltaic element.

The lower cell 111 comprises an n-type semiconductor layer 103, an i-type semiconductor layer 104 and a p-type semiconductor layer 105 which are laminated in this order from the side of the substrate 101. The middle cell 112 comprises an n-type semiconductor layer 114, an i-type semiconductor layer 115 and a p-type semiconductor layer 116 which are laminated in this order from the side of the substrate 101.

The top cell 113 comprises an n-type semiconductor layer 117, an i-type semiconductor layer 118 and a p-type semiconductor layer 119 which are laminated in this order from the side of the substrate 101.

Reference numeral 106 stands for a transparent electrode disposed on the p-type semiconductor layer 119 of the top cell 113. On the transparent electrode 106, there is provided a collecting electrode 107.

In the triple cell tandem stacked type pin heterojunction photovoltaic element 120 shown in FIG. 1(C), light is impinged from the side of the transparent electrode 106.

For this pin heterojunction photovoltaic element, it is also possible to transpose the n type semiconductor layer and the p-type semiconductor layer in accordance with the desired use requirements.

Explanation will be made for the substrate, each constituent semiconductor layer and each constituent electrode in the pin heterojunction photovoltaic element of the present invention.

Substrate

The substrate 101 used in the pin heterojunction photovoltaic element according to the present invention may be of single crystal material or non-single crystal material. It may be electroconductive or electrically insulating, and it may be transparent or opaque. Usable as such substrate are, for example, Fe, Ni, Cr, Al, Mo, Au, Nb, Ta, V, Ti, Pt, and Pb and alloys thereof such as brass and stainless steel. Other than these, there can be mentioned films or sheets of synthetic resin such as polyester, polyethylene, polycarbonate, cellulose acetate, polypropylene, polyvinyl chloride, polyvinylidene chloride, polystyrene, polyamide, polyimide and the like, and glass or ceramics.

Examples of the substrate comprising a single crystal material are, for example, wafer-like shaped members obtained by slicing an appropriate single crystal of Si, Ge, C, NaCl, KCl, LiF, GaSb, InAs, InSb, GaP, MgO, $CaF_2$, $BaF_2$, $\alpha-Al_2O_3$ or the like. The surface of any of said wafer-like shaped members may be provided with an epitaxially grown layer of the same constituent(s) as the member or of a material whose lattice constant is close to that of the constituent(s) of the member.

The shape of the substrate may be optionally determined in accordance with the end use purpose. Examples are plate, belt, drum and suitable like shapes having a plane or uneven surface. The thickness of the substrate is properly determined so that the layer structure of the photovoltaic member can be formed as desired. In the case where flexibility is required for the photovoltaic element to be prepared, it can be made as thin as possible within a range capable of sufficiently providing the functions as the substrate. However, the thickness of the substrate is usually not less than 10 microns from the view points of its manufacturing and handling conveniences and its strength.

Electrodes

In the photovoltaic element according to the present invention, appropriate electrodes are used in accordance with the configuration of the photovoltaic element to be prepared. As such electrodes, there can be mentioned the lower electrode, upper electrode (transparent electrode) and collecting electrode. Said upper electrode denotes the one to be placed at the side on which light is impinged, and said lower electrode denotes the one to be placed opposite to the upper electrode through the semiconductor layers to be arranged between the two electrodes.

These electrodes will be explained in the following.

(i) Lower electrode

For the pin heterojunction photovoltaic element according to the present invention, the side through which light is impinged is determined depending upon whether there is used a transmissive member or an opaque member as the substrate 101.

In this connection, the position where the lower electrode 102 is to be placed is properly determined by the kind of substrate 101 to be used. For example, in the case where an opaque member such as a metal member is used as the substrate 101, light for the generation of a photoelectromotive force is impinged from the side of the transparent electrode 106.

Now, in the case where the pin heterojunction photovoltaic element is of the configuration as shown in FIG. 1(A) or FIG. 1(C), the lower electrode 102 is desired to be placed between the substrate 101 and the n-type semiconductor layer 103. In this case, if the substrate 101 comprises an electroconductive member, it can function also as the lower electrode. However, in the case where the substrate 101 is electroconductive but is of a high sheet resistance, the lower electrode may be disposed as a lower resistance electrode serving to output the current or in order to heighten the reflectivity of the incident light at the surface of the substrate 101 so as to make it utilized more efficiently.

In the case of FIG. 1(B), there is used a transmissive member as the substrate 101 and light is impinged from the side of the substrate 101. In this connection, the lower electrode 102 serving to output a current is placed on the surface of the top semiconductor layer over the substrate 101. However, in the case where there is used an electrically insulating member as the substrate 101 as in the case of 1(B), the lower electrode 102 serving to output the current is placed between the substrate 101 and the n-type semiconductor layer 103.

The electrode 102 may be a thin film of a metal selected from the group consisting of Ag, Au, Pt, Ni, Cr, Cu, Al, Ti, Zn, Mo and W. Said metallic thin film may be formed by way of the known vacuum deposition technique, electron-beam deposition technique or sputtering technique. However, due consideration should be given that the metallic thin film to be thus formed is not a resistive component for the photovoltaic element. In this respect, the metallic thin film constituting the electrode 102 preferably has a sheet resistance of 50 $\Omega$ or less, more preferably, 10 $\Omega$ or less.

In the alternative, it is possible to place a diffusion preventive layer comprising an electroconductive material such as zinc oxide between the lower electrode 102 and the n-type semiconductor layer 103. (This is not shown in the figures.)

In the case where such diffusion preventive layer is used as mentioned above, the following advantages will be expected: (a) it prevents the metal elements constituting the electrode 102 from diffusing into the n-type semiconductor layer 103; (b) being provided with a certain resistance value, it prevents the occurrence of shorts, which would otherwise occur between the lower electrode 102 and the transparent electrode 106 through the semiconductor layers arranged between them due to pinholes and the like; and (c) it serves to generate multiple interference effects with the thin film and confine the impinged light within the photovoltaic element.

(ii) Upper electrode (transparent electrode)

The transparent electrode 106 is desired to have a light transmittance of more than 85% so that it serves to make the semiconductor layer efficiently absorb sunlight or fluorescent light. In addition to this, it is desired to have a sheet resistance of 100 $\Omega$ or less from the viewpoint of preventing the internal resistance of the photovoltaic element from becoming great thereby impairing the performance.

In view of the above, the transparent electrode 106 is desired to comprise a thin film of a metal oxide selected from the group consisting of $SnO_2$, $In_2O_3$, ZnO, CdO, $Cd_2SnO_2$ and ITO ($In_2O_3+SnO_2$) or a semitransparent thin film of a metal selected from the group consisting of Au, Al and Cu.

The transparent electrode 106 is disposed on the p-type semiconductor layer in the case of the photovoltaic element shown in FIG. 1(A) or FIG. 1(C), and it is disposed on the substrate 101 in the case of the photovoltaic element shown in FIG. 1(B).

In any of these cases, it is necessary to constitute the transparent electrode 106 with a thin film member selected from the foregoing which is good in adhesion with the layer or the substrate.

The transparent electrode 106 comprising such thin film may be formed by way of the known resistance heating deposition technique, electron-beam heating deposition technique, reactive sputtering technique or spraying technique.

(iii) Collecting electrode

The collecting electrode 107 in the photovoltaic element according to the present invention is disposed on the transparent electrode 106 for the purpose of reducing the surface resistance of said transparent electrode.

The collecting electrode 107 is desired to comprise a metallic thin film of Ag, Cr, Ni, Al, Au, Ti, Pt, Cu, Mo, W or an alloy of these metals. It is possible for the collecting electrode 107 to be constituted with a member comprising a stacked plurality of such metallic thin films.

The shape and the area of the collecting electrode 107 are properly designed so that a sufficient quantity of light can be received by the semiconductor layer.

Specifically as for the shape, it is desired to be such that it extends uniformly all over the light receiving face of the photovoltaic element. As for the area, it is desired to cover 15% or less of said light receiving face in a preferred embodiment or 10% or less in a more preferred embodiment.

The member constituting the collecting electrode 107 preferably has a sheet resistance of 50 $\Omega$ or less, more preferably, 10 $\Omega$ or less.

i-type semiconductor layer

In a preferred embodiment, the i-type semiconductor layer in any of the pin heterojunction photovoltaic elements shown in FIGS. 1(A) to 1(C) according to the present invention is formed of a proper i-type non-single crystal semiconductor film. Preferable as such i-type non-single crystal semiconductor film are a-Si:H film, a-Si:F film, a-Si:H:F film, a-SiC:H film, a-SiC:F film, a-siC:H:F film, a-SiGe:H film, a-SiGe:F film, a-SiGe:H:F film, poly-Si:H film, poly-Si:F film and poly-Si:H:F film.

The pin heterojunction photovoltaic element according present invention is based on the combined use of the above i-type semiconductor layer and the p-type or/and n-type semiconductor layer formed of the foregoing poly-GaP:H(F):M semiconductor film and because of this, it provides the foregoing various significant effects.

This situation will be made further apparent from the results obtained through the following experiment.

EXPERIMENT D

There were prepared nineteen pin heterojunction photovoltaic element samples (Samples Nos. 91 to 109) of the configuration shown in FIG. 1(B) by using non-single crystal films containing silicon atoms (Si) as a matrix and one or more kinds of atoms selected from the group consisting of hydrogen atoms (H) and fluorine atoms (F) in order to form the i-type or n-type semiconductor layer; other non-single crystal silicon-containing films containing neither hydrogen atoms (H) nor fluorine atoms (F) in order to form the i-type semiconductor layer; the foregoing poly-Gap:H(F):M semiconductor films according to the present invention film in order to form the p-type semiconductor layer or/and the n-type semiconductor layer; and the known GaP film in order to form the p-type semiconductor layer.

In each of the pin heterojunction photovoltaic element samples Nos. 91 to 109, as the substrate 101 there was used a quartz glass plate. As the transparent electrode 106, there was formed a ITO thin film on the substrate 101 by means of a conventional reactive sputtering deposition technique. As the electrode 102, there was used a Ag thin film formed by a conventional electron-beam deposition technique.

Each of the pin heterojunction photovoltaic element samples Nos. 91 to 109 was made such that light is to be impinged from the side of the substrate 101.

In the case of the pin heterojunction photovoltaic element sample having the p-type semiconductor layer comprised of the foregoing poly-GaP:H(F):Mp semiconductor film according to the present invention, said p-type semiconductor layer was formed by repeating the foregoing procedures for preparing the film sample No. 76 (by the reactive sputtering method).

Likewise, in the case of the pin heterojunction photovoltaic element sample having the n-type semiconductor layer comprised of the foregoing poly-GaP:H(F):Mn semiconductor film according to the present invention, said n-type semiconductor layer was formed by repeating the foregoing procedures for preparing the film sample No. 36 (by the HR-CVD method).

The known i-type semiconductor film, n-type semiconductor film, or p-type semiconductor film in any of the pin heterojunction photovoltaic elements was formed in the known manner.

In the case of the pin heterojunction photovoltaic element sample having the p-type semiconductor layer comprised of a known p-type GaP semiconductor film, said p-type semiconductor layer was formed by a conventional sputtering deposition method.

The layer constitution of each of the pin heterojunction photovoltaic element samples Nos. 91 to 109 prepared was shown in Table 8.

For each of the pin heterojunction photovoltaic element samples Nos. 91 to 109 thus obtained, there were evaluated a short-circuit current (Isc) under irradiation of AM-1 light (100 mW/cm$^2$) and an open-circuit voltage (Voc).

The results obtained are collectively shown in Table 8.

From the results obtained through the experiment, the following findings have been obtained. That is, it has been found that in each of the cases (Samples Nos 91–93 and 97–99) where the n-type and i-type layers are formed of the same kind of a semiconductor film and the p-type layer is formed of the poly-GaP:H(F):Mp semiconductor film according to the present invention, the Isc and the Voc exhibited surpass those exhibited by any of the pin heterojunction photovoltaic elements (Samples Nos. 104–109) in which the p-type semiconductor layer is formed of the known p-type GaP semiconductor film, and the n-type and i-type semiconductor layers are formed of those silicon-containing non-single crystal semiconductor films used in Samples Nos. 91–99. It has been also found that in any of the cases (Samples Nos. 94–96) where the p-type and n-type semiconductor layers are formed of the poly-GaP:H(F):M semiconductor film according to the present invention and the i-type semiconductor layer is formed of a a-Si:H film, a-Si:F film or a-Si:H:F film, the Voc is markedly improved.

On the other hand, in each of the cases (Samples Nos. 100–103) in which the p-type semiconductor layer is formed of the poly-GaP:H(F):Mp semiconductor film, the n-type semiconductor layer is formed of an n-type a-Si:H film, and the i-type semiconductor layer is formed of an a-Si film, a-SiC film, a-SiGe film or poly-Si film, it has been found that there are not provided desirable Isc and Voc and thus, each of them is not practically acceptable.

In view of the above, it has been recognized that for the pin heterojunction photovoltaic element according to the present invention, it is necessary for the i-type semiconductor layer to be formed of a silicon-containing semiconductor film containing hydrogen atoms (H) or/and fluorine atoms (F) selected from the group consisting of a-Si:H film, a-Si:F film, a-Si:H:F film, a-SiC:H film, a-SiC:F film, a-SiC:H:F film, a-SiGe:H film, a-SiGe:F film, a-SiGe:H:F film, poly-Si:H film, poly-Si:F film and poly-Si:H:F film.

In order to form a desirable pin heterojunction in the preparation of the pin heterojunction photovoltaic element according to the present invention, it is desired to continuously form the n-type semiconductor layer, the i-type semiconductor layer and the p-type semiconductor layer under an enclosed vacuum condition. In a preferred embodiment in this respect, the formation of said pin heterojunction is carried out in a single film-forming apparatus. In the alternative, it is possible to form one semiconductor layer in a film-forming apparatus, to transfer the substrate having the semiconductor layer formed thereon through a gate valve into an other film-forming apparatus and to form a successive semiconductor layer on the previously formed semiconductor layer therein.

DESCRIPTION OF THE PREFERRED EMBODIMENTS

The present invention will be described more specifically while referring to Examples, but the present invention is not intended to limit the scope only to these examples.

EXAMPLE 1

There was prepared a pin heterojunction photovoltaic element of the configuration shown in FIG. 1(A) by the foregoing process (1) (HR-CVD method) practiced in the HR-CVD apparatus shown in FIG. 2 in the following way.

As the substrate 101, there was used a stainless steel plate of 50 mm by 50 mm in size.

Firstly, the substrate was placed in a known sputtering apparatus (not shown). The sputtering apparatus was evacuated to a vacuum of about $1 \times 10^{-5}$ Torr or below. On the substrate was deposited a Ag thin film of about 1000 Å in thickness as the lower electrode 102 by sputtering Ag in Ar gas. The substrate was taken out from the sputtering apparatus and then fixed, with the lower electrode 102 facing downward, onto the substrate holder 202 on the substrate transfer unit 206 positioned in the load lock chamber 212. The load lock chamber 212 was evacuated to $10^{-5}$ Torr or below by means of a vacuum pump (not shown). During evacuation, the film-forming chamber 201 was evacuated to $10^{-5}$ Torr or below by means of the vacuum pump 221. When the pressures in the two chambers became almost balanced, the two chambers were opened and the substrate transfer unit 206 was moved through the gate valve 207 to the film forming chamber 201. Then, the gate valve 207 was closed. The substrate (203 in FIG. 2) was heated to 220° C. by actuating the heater 205 and it was maintained at this temperature. Thereafter, $Si_2F_6$ gas and $PH_3$ gas diluted with $SiF_4$ gas to 4000 ppm (hereinafter referred to as "$PH_3/SiF_4$ gas") were introduced through the gas supply pipe 214 into the activation chamber 208 maintained at 700° C. by the activation energy generation means 211 at respective flow rates of 25 sccm and 10 sccm while being mixed. At the same time, He gas and $H_2$ gas were introduced through the gas supply pipe 215 into the activation chamber 209 at respective flow rates of 100 sccm and 50 sccm while being mixed. The inner pressure of the film-forming chamber 201 was kept at 0.3 Torr by regulating the exhaust valve 220. Film-forming was started by applying microwave power (2.45 GHz) of 300W from the activation energy generation means 212 into the activation chamber 209. Precursors generated in the activation chamber 208 and hydrogen radicals generated in the activation chamber 209 were successively transported respectively through the transport conduits 217 and 218 into the film-forming chamber 201, where they were chemically reacted to form a 400 Å thick n-type a-Si:H:F:P semiconductor film as the n-type semiconductor layer 103 on the Ag thin film as the lower electrode 102. The application of microwave power and the introduction of gases were suspended, and the film-forming chamber 201 was evacuated to $10^{-5}$ Torr or below by the vacuum pump.

Then, the substrate (203) was moved through the gate valve 207 into the film-forming chamber 222 having the same constitution as that of the film-forming chamber 201 which had been evacuated to $10^{-5}$ Torr or below by means of the substrate transfer unit 206. Then, the above film-forming procedures were repeated, except that only $Si_2F_6$ gas was introduced at a flow rate of 30 sccm without using the $PH_3/SiF_4$ gas and the microwave power was changed to 400W, to thereby form a 3500 Å thick non-doped a-Si:H:F film as the i-type semiconductor layer 104 on the previously formed n-type semiconductor layer 103.

The application of microwave power and the introduction of gases were suspended, and the film-forming chamber 222 was evacuated to $10^{-5}$ Torr or below. Then, the substrate (203) was moved through the gate valve into a film-forming chamber (not shown) have the same constitution as that of the film-forming chamber 201 which had been evacuated to $10^{-5}$ Torr or below.

Then, liquid mixture composed of $Ga(CH_3)_2$ and $Zn(CH_3)_2$ with the quantitative ratio of $10^4:1$ in a bubbling vessel (not shown) was gasified by bubbling it with He gas (as a carrier gas) being supplied at a flow rate of 20 sccm to generate a raw material gas containing said two compounds. The resultant raw material gas was successively introduced through the gas supply pipe 214 into the activation chamber 208 at a flow rate of $3.0 \times 10^{-4}$ mol/min, into which microwave power (2.45 GHz) of 60W from the activation energy generation means 211 was applied. At the same time, $PF_5$ gas was introduced at a flow rate of 5.5 sccm through the gas supply pipe 216 into the activation chamber 210 maintained at 500° C. by the activation energy generation means 213. Concurrently, $H_2$ gas and He gas were introduced through the gas supply pipe 215 into the activation chamber 209 at respective flow rates of 8 sccm and 40 sccm while being mixed, into which microwave power (2.45 GHz) of 300W from the activation energy generation means 212 was applied. At this time, the inner pressure of the film-forming chamber was controlled to 60 m Torr. Precursors generated in the activation chamber 208, other precursors generated in the activation chamber 210 and hydrogen radicals generated in the activation chamber 209 were successively introduced into the film-forming chamber respectively through the transport conduits 217, 219 and 218, where they were chemically reacted to form a 200 Å thick p-type poly-GaP:H:F:Zn semiconductor film as the p-type semiconductor layer 105 on the previously formed i-type semiconductor layer on the substrate maintained at 210° C., the substrate being placed at a position 8 cm away from the outlet of the transport conduit 218 for the hydrogen radicals.

Thereafter, the substrate transfer unit was moved to the load lock chamber through the gate valve. After cooling therein, the substrate on which were deposited the n-type, i-type and p-type semiconductor layers was taken out. Then, the substrate was placed in a known vacuum deposition apparatus, which was evacuated to $10^{-5}$ Torr or below. On the foregoing p-type semiconductor layer 105 on the substrate was deposited an ITO thin film of about 700 Å in thickness in an oxygen atmosphere at about $1 \times 10^{-3}$ Torr. The source of deposition was a 1:1 (by weight) mixture of In and Sn placed in a crucible which was heated by the resistance heating method. The substrate temperature was 170° C. In this way the transparent electrode 106 was formed. After cooling, the substrate was removed. With a permalloy mask placed on the transparent electrode 106, the substrate was placed in another known vacuum deposition apparatus, which was evacuated to $1 \times 10^{-5}$ Torr or below. An Ag thin film of about 0.8 μm in thickness was deposited by the resistance heating method to form an about 0.8 μm thick comb-shaped collecting electrode 107. Thus there was obtained Element Sample No. 1. The characteristics of Element Sample No. 1 as a solar cell were evaluated in the following manner.

The open-circuit voltage (Voc) and the short-circuit current (Isc) which are produced when the transparent electrode is irradiated with AM-1 light (100 mW/cm²) were measured. The relative value of output obtained when AM-1 light is irradiated through an interference filter of 400 nm was also measured. Said relative value is a value obtained when the value obtained when the comparative element sample prepared in the later described Comparative Example 1 was measured under the same condition as in the above was made to be the control (1).

The measured results are shown in Table 9.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 9.

Example 2

There was prepared a pin heterojunction photovoltaic element (Element Sample No. 2) of the configuration shown in FIG. 1(A) by repeating the procedures of Example 1, except that the p-type semiconductor layer 105 was formed by the foregoing process (2)(reactive sputtering method) practiced in the reactive sputtering apparatus shown in FIG. 3 in the following manner.

That is, the substrate having the lower electrode 102, the n-type semiconductor layer 103 and the i-type semiconductor layer 104 thereon which were formed respectively in the same manner as in Example 1 was moved by the substrate transfer unit into the other film-forming chamber comprising the reactive sputtering film-forming chamber 301 shown in FIG. 3. The film-forming chamber 301 was evacuated to $1 \times 10^{-5}$ Torr or below. The substrate was heated to 220° C. by actuating the heater 305 and it was maintained at this temperature. Film-forming was conducted under the conditions shown in Table 10 to thereby form a 200 Å thick p-type poly-GaP:H:F:Zn semiconductor film as the p-type semiconductor layer 105 on the previously formed i-type semiconductor layer 104. Thereafter, the substrate was moved to the load lock chamber and it was cooled therein.

The substrate was taken out therefrom, and on the foregoing p-type semiconductor layer 105 was formed a about 700 Å thick ITO film as the transparent electrode 106 and then about 0.8 μm thick comb-shaped collecting electrode 107 comprising an 0.8 μm thick Ag thin film in the same manner as in Example 1.

Thus there was obtained Element Sample No. 2.

The characteristics of Element Sample No. 2 as a solar cell were evaluated in the same manner as in Example 1.

The results obtained are shown in Table 9.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 9.

EXAMPLE 3

There was prepared a pin heterojunction photovoltaic element of the configuration shown in FIG. 1(A)-(Element Sample No. 3) by repeating the procedures of Example 1, except that the p-type semiconductor layer 105 was formed by the foregoing process (3)(plasma CVD method) practiced in the plasma CVD apparatus shown in FIG. 4 in the following manner.

That is, the substrate having the lower electrode 102, the n-type semiconductor layer 103 and the i-type semiconductor layer 104 thereon which were formed respectively in the same manner as in Example 1 was moved by the substrate transfer unit into the other film-forming chamber comprising the plasma CVD film-forming chamber 401 shown in FIG. 4. The film-forming chamber 401 was evacuated to $1 \times 10^{-5}$ or below. The substrate was heated to 230° C. by the heater 405 and it was maintained at this temperature. Then, raw material gas (A), raw material gas (B) and raw material gas (C) shown in Table 11 were introduced through the respective gas supply pipes 408 and 409 into the film-forming chamber 401 under the respective conditions shown in Table 11. The inner pressure of the film-forming chamber 401 was controlled to and maintained at 0.8 Torr by regulating the exhaust valve 414 and while monitoring by the pressure gage 417. High frequency power (13.56 MHz) of 70W from the high frequency power source 410 was applied through the cathode 412 into the film-forming chamber 401 to thereby form a 200Å thick p-type poly-GaP:H:F:Zn semiconductor film as the p-type semiconductor layer 105 on the previously formed i-type semiconductor layer. Thereafter, the substrate transfer unit was moved to the load lock chamber and it was cooled therein.

The substrate was taken out therefrom, and on the foregoing p-type semiconductor layer 105 was formed a about 700Å thick ITO film as the transparent electrode 106 and then an about 0.8 μm thick comb-shaped collecting electrode 107 comprising an 0.8 μm thick Ag thin film in the same manner as in Example 1.

Thus there was obtained Element Sample No. 3.

The characteristics of Element Sample No. 3 as a solar cell were evaluated in the same manner as in Example 1. The results obtained are shown in Table 9.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 9.

EXAMPLE 4

There was prepared a pin heterojunction photovoltaic element of the configuration shown in FIG. 1(A)- (Element Sample No. 4) by repeating the procedures of Example 1, except that the i-type semiconductor layer 104 was formed of a non-doped i-type a-SiC:H:F film which was prepared in the following manner.

That is, after the n-type semiconductor layer 103 was formed, the substrate was moved by the substrate transfer unit through the gate valve to the other film-forming chamber having the same constitution as that of the film-forming chamber 201.

The gate valve was closed and the film-forming chamber was evacuated to and maintained at $1 \times 10^{-5}$ Torr or below. The substrate was then heated to 220° C. by actuating the heater 205 and it was maintained at this temperature. Thereafter, raw material gas (A), raw material gas (B) and raw material gas (C) shown in Table 12 were introduced into the respective activation chambers 208, 209 and 210, wherein they were separately activated under the respective activation conditions shown in Table 12 to generate respective active species. The respective active species were separately introduced through the respective transport conduits 217, 218 and 219 into the film-forming chamber, wherein they were chemically reacted to form a 3500 Å thick non-doped i-type a-SiC:H:F film as the i-type semiconductor layer 104 on the previously formed n-type semiconductor layer 103 comprising a 400 Å thick n-type a-Si:H:F:P semiconductor film.

On the thus formed i-type semiconductor layer 104 was formed a 200 Å thick p-type poly-GaP:H:F.Zn semiconductor film as the p-type semiconductor layer 105 in the same manner as in Example 1. Thereafter, the substrate transfer unit was moved to the load lock chamber and it was cooled therein.

The substrate was taken out therefrom, and on the foregoing p-type semiconductor layer 105 was formed an about 700 Å thick ITO film as the transparent electrode 106 and then an about 0.8 μm thick comb-shaped collecting electrode 107 comprising an 0.8 μm thick Ag thin film in the same manner as in Example 1.

Thus there was obtained Element Sample No. 4.

The characteristics of Element Sample No. 4 as a solar cell were evaluated in the same manner as in Example 1. The results obtained were shown in Table 9.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 9.

EXAMPLE 5

There was prepared a pin heterojunction photovoltaic element of the configuration shown in FIG. 1(A)- (Element Sample No. 5) by repeating the procedures of Example 1, except that the i-type semiconductor layer 104 was formed of a non-doped i-type a-SiGe:H:F film which was prepared in the following manner.

That is, after the n-type semiconductor layer 103 was formed, the substrate was moved by the substrate transfer unit through the gate valve to the other film-forming chamber having the same constitution as that of the film-forming chamber 201.

The gate valve was closed and the film-forming chamber was evacuated to and maintained at $1 \times 10^{-5}$ Torr or below. The substrate was then heated to 220° C. by actuating the heater 205 and it was maintained at this temperature. Thereafter, raw material gas (A), raw material gas (B) and raw material gas (C) shown in Table 13 were introduced into the respective activation chambers 208, 209 and 210, wherein they were separately activated under the respective activation conditions shown in Table 13 to generate respective active species. The respective active species were separately introduced through the respective transport conduits 217, 218 and 219 into the film-forming chamber, wherein they were chemically reacted to form a 3500 Å thick non-doped i-type a-SiGe:H:F film as the i-type semiconductor layer 104 on the previously formed n-type semiconductor layer 103 comprising a 400 Å thick n-type a-Si:H:F:P semiconductor film.

On the thus formed i-type semiconductor layer 104 was formed a 200 Å thick p-type poly-GaP:H:F:Zn semiconductor film as the p-type semiconductor layer 105 in the same manner as in Example 1. Thereafter, the substrate transfer unit was moved to the load lock chamber and it was cooled therein.

The substrate was taken out therefrom, and on the foregoing p-type semiconductor layer 105 was formed an about 700 Å thick ITO film as the transparent electrode 106 and then an about 0.8 μm thick comb-shaped collecting electrode 107 comprising an 0.8 μm thick Ag thin film in the same manner as in Example 1.

Thus there was obtained Element Sample No. 5.

The characteristics of Element Sample No. 5 as a solar cell were evaluated in the same manner as in Example 1. The measured results are shown in Table 9.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 9.

EXAMPLE 6

There was prepared a pin heterojunction photovoltaic element of the configuration shown in FIG. 1(A)-(Element Sample No. 6) by repeating the procedures of Example 1, except that the i-type semiconductor layer 104 was formed of a non-doped i-type poly-Si:H:F film which was prepared in the following manner.

That is, after the n-type semiconductor layer 103 was formed, the substrate was moved by the substrate transfer unit through the gate valve to the other film-forming chamber having the same constitution as that of the film-forming chamber 201.

The gate valve was closed and the film-forming chamber was evacuated to and maintained at $1 \times 10^{-5}$ Torr or below. The substrate was then heated to 220° C. by actuating the heater 205 and it was maintained at this temperature.

Thereafter, raw material gas (A) and raw material gas (B) shown in Table 14 were introduced into the respective activation chambers 208 and 209, wherein they were separately activated under the respective activation conditions shown in Table 14 to generate respective active species. The respective active species were separately introduced through the respective transport conduits 217 and 218 into the film-forming chamber, wherein they were chemically reacted to form a 8000 Å thick non-doped i-type poly-Si:H:F film as the i-type semiconductor layer 104 on the previously formed n-type semiconductor layer comprising a 400 Å thick n-type a-Si:H:F:P semiconductor film.

On the thus formed i-type semiconductor layer 104 was formed a 200 Å thick p-type poly-GaP:H:F:Zn semiconductor film as the p-type semiconductor layer 105 in the same manner as in Example 1. Thereafter, the substrate transfer unit was moved to the load lock chamber and it was cooled therein.

The substrate was taken out therefrom, and on the foregoing p-type semiconductor layer 105 was formed an about 700 Å thick ITO film as the transparent electrode 106 and then an about 0.8 μm thick comb-shaped collecting electrode 107 comprising an 0.8 μm thick Ag thin film in the same manner as in Example 1.

Thus there was obtained Element Sample No. 6.

The characteristics of Element Sample No. 6 as a solar cell were evaluated in the same manner as in Example 1. The results obtained are shown in Table 9.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 9.

EXAMPLE 7

There was prepared a pin heterojunction photovoltaic element of the configuration shown in FIG. 1(B)(Element Sample No. 7) in accordance with the manner of Example 1.

That is, as the substrate 101, there was used a Corning glass plate No. 7059 of 50 mm by 50 mm in size. On the substrate was formed an ITO thin film of about 500 Å in thickness as the transparent electrode 106 by the resistance heating method. The procedures of forming the p-type semiconductor layer in Example 1 were repeated to form a 200 Å thick p-type poly-GaP:H:F:Zn semiconductor film as the p-type semiconductor layer 105 on the transparent electrode. Then, the procedures for forming the i-type semiconductor layer in Example 1 were repeated to form a 3500 Å thick non-doped i-type a-Si:H:F film as the i-type semiconductor layer 104 on the p-type semiconductor layer. Successively, there was formed a 400 Å thick n-type a-Si:H:F:P semiconductor film as the n-type semiconductor layer 103 on the i-type semiconductor layer 104 by repeating the procedures of forming the n-type semiconductor layer in Example 1. On this n-type semiconductor was formed a 0.5 μm thick electrode comprising a 0.5 μm thick Ag film as the electrode 102 by repeating the procedures of forming the comb-shaped collecting electrode in Example 1. Thus there was obtained Element Sample No. 7. The characteristics of Element Sample No. 7 as a solar cell were evaluated in the same manner as in Example 1.

The results obtained are shown in Table 9.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 9.

EXAMPLE 8

There was prepared a pin heterojunction photovoltaic element of the configuration shown in FIG. 1(A)-(Element Sample No. 8) by repeating the procedures of Example 1, except that the n-type semiconductor layer 104 was formed of an n-type poly-GaP:H:F:Se semiconductor film which was prepared in the following manner.

That is, after the lower electrode 102 was formed, the substrate was moved by the substrate transfer unit and through the gate valve to the other film-forming chamber having the same constitution as that of the film-forming chamber 201.

The gate valve was closed and the film-forming chamber was evacuated to and maintained at $1 \times 10^{-5}$ Torr or below. The substrate was then heated to 220° C.

by actuating the heater 205 and it was maintained at this temperature. Then, liquid composed of Ga(CH$_3$)$_3$ and Se(CH$_3$)$_2$ with the quantitative ratio of 10$^4$:1 in a bubbling vessel (not shown) was gasified by bubbling it with He gas (as a carrier gas) supplied at a flow rate of 15 sccm to generate a raw material gas containing said two compounds. The resultant raw material gas was successively introduced through the gas supply pipe 214 into the activation chamber 208 at a flow rate of 4.0×10$^{-4}$ mol/min High frequency power (13.56 MHz) of 80W from the activation energy generation means 211 was applied into the activation chamber 208 to generate precursors, which were successively introduced through the transport conduit 217 into the film-forming chamber 201. At the same time, PF$_5$ gas was introduced through the gas supply pipe 216 into the activation chamber 210 maintained at 500° C. by the activation energy generation means 213 at a flow rate of 6 sccm, to thereby generate precursors containing fluorine radicals, which were successively introduced through the transport conduit 219 into the film-forming chamber 201. Concurrently, H$_2$ gas and He gas were introduced through the gas supply pipe 215 into the activation chamber 209 at respective flow rates of 7 sccm and 60 sccm while being mixed, into which microwave power (2.45 GHz) of 50W from the activation energy generation means 212 was applied to generate hydrogen radicals, which were successively introduced through the transport conduit 218 (the outlet of which is 7 cm distant from the substrate) into the film-forming chamber 201.

At this time, the inner pressure was maintained at 70 m Torr.

The foregoing precursors and hydrogen radicals thus introduced into the film-forming chamber 201 were chemically reacted to form a 400 Å thick n-type poly-GaP:H:F:Se semiconductor film as the n-type semiconductor layer 103 on the lower electrode 102. The film-forming conditions in this case were shown in Table 15.

On this n-type semiconductor layer was formed a 3500 Å thick non-doped i-type a-Si:H:F film as the i-type semiconductor layer 104 by repeating the procedures of forming the i-type semiconductor layer in Example 1. Then, on this i-type semiconductor layer was formed a 200 Å thick p-type poly-GaP:H:F:Zn semiconductor film as the p-type semiconductor layer 105 by repeating the procedures of forming the p-type semiconductor layer in Example 1. On this p-type semiconductor layer were successively formed a 700 Å thick ITO film as the transparent electrode 106 and an 0.8 μm thick comb shaped film comprising a 0.8 μm thick Ag film as the collecting electrode 107 respectively in the same manner as in Example 1.

Thus there was obtained Element Sample No. 8.

The characteristics of Element Sample No. 8 as a solar cell were evaluated in the same manner as in Example 1.

The results obtained are shown in Table 9.

Besides the foregoing, using two quartz glass plates, there were formed an n-type poly-GaP:H:F:Se semiconductor film and a p-type poly-GaP:H:F:Zn semiconductor film separately by repeating the foregoing procedures for the formation of the n-type semiconductor layer 103 and for the formation of the p-type semiconductor layer 105.

Each of the two resultant films was examined for hydrogen content, fluorine content, and the average size of crystal grains in the film in the same manner as above described.

The results are shown in Table 9.

EXAMPLE 9

There was prepared a pin heterojunction photovoltaic element of the configuration shown in FIG. 1(A)- (Element Sample No. 9) by repeating the procedures of Example 1, except that the n-type semiconductor layer 103 was formed of a 400 Å thick n-type GaP:Se semiconductor which was prepared in accordance with a known sputtering method under the conditions shown in Table 16.

The characteristics of Element Sample No. 9 as a solar cell were evaluated in the same manner as in Example 1.

The results obtained are shown in Table 17.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 17.

EXAMPLE 10

There was prepared a pin heterojunction photovoltaic element of the configuration shown in FIG. 1(A)- (Element Sample No. 10) by repeating the procedures of Example 1, except that the n-type semiconductor layer 103 was formed of a 400 Å thick n-type a-SiGe:H:F:P semiconductor film which was prepared by the foregoing process (3) by the plasma CVD method practiced in the plasma CVD apparatus shown in FIG. 4 under the conditions shown in Table 18.

The characteristics of Element Sample 10 as a solar cell were evaluated int he same manner as in Example 1.

The results obtained are shown in Table 17.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 17.

EXAMPLE 11

There was prepared a pin heterojunction photovoltaic element of the configuration shown in FIG. 1(A)- (Element Sample No. 11) by repeating the procedures of Example 1, except that the n-type semiconductor layer 103 was formed of a 400 Å thick n-type a-SiC:H:F:P semiconductor film which was prepared by the foregoing process (3) by the plasma CVD method practiced in the plasma CVD apparatus shown in FIG. 4 under the conditions shown in Table 19.

The characteristics of Element Sample 11 as a solar cell were evaluated in the same manner as in Example 1.

The results obtained are shown in Table 17.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 17.

EXAMPLE 12

There was prepared a pin heterojunction photovoltaic element of the configuration shown in FIG. 1(A)-(Element Sample No. 12) by repeating the procedures of Example 1, except that the n-type semiconductor layer 103 was formed of a 400 Å thick n-type GaAs:Si semiconductor film which was prepared by the foregoing process (2) by the reactive sputtering method practiced in the reactive sputtering apparatus shown in FIG. 3 under the conditions shown in Table 20.

The characteristics of Element Sample 12 as a solar cell were evaluated in the same manner as in Example 1.

The results obtained are shown in Table 17.

Besides the foregoing, using a quartz glass plate, there was formed a p-type poly-GaP:H:F:Zn semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 17.

EXAMPLE 13

There was prepared a pin heterojunction photovoltaic element of the configuration shown in FIG. 1(A)-(Element Sample No. 13) by repeating the procedures of Example 8, except that the i-type semiconductor layer 104 was formed of a 3500 Å thick non-doped i-type a-Si:H semiconductor film which was prepared by the foregoing process (3) by the plasma CVD method practiced in the plasma CVD apparatus shown in FIG. 4 under the conditions shown in Table 21.

The characteristics of Element Sample 13 as a solar cell were evaluated in the same manner as in Example 1.

The results obtained are shown in Table 17.

Besides the foregoing, using two quartz glass plates, there were formed an n-type poly-GaP:H:F:Se semiconductor film and a p-type poly-GaP:H:F:Zn semiconductor film separately by repeating the foregoing procedures for the formation of the n-type semiconductor layer 103 and the formation of the p-type semiconductor layer 105.

Each of the resultant films was examined for hydrogen content, fluorine content, and the average size of crystal grains in the film in the same manner as above described.

The results are shown in Table 17.

EXAMPLE 14

There was prepared a pin heterojunction photovoltaic element of the configuration shown in FIG. 1(A)-(Element Sample No. 14) by repeating the procedures of Example 8, except that the i-type semiconductor layer 104 was formed of a 3500 Å thick non-doped i-type a-SiGe:H semiconductor film which was prepared by the foregoing process (3) by the plasma CVD method practiced in the plasma CVD apparatus shown in FIG. 4 under the conditions shown in Table 22.

The characteristics of Element Sample 14 as a solar cell were evaluated int he same manner as in Example 1.

The results obtained are shown in Table 17.

Besides the foregoing, using two quartz glass plates, there were formed each of an n-type poly-GaP:H:F:Se semiconductor film and a p-type poly-GaP:H:F:Zn semiconductor film separately by repeating the foregoing procedures for the formation of the n-type semiconductor layer 103 and the formation of the p-type semiconductor layer 105.

Each of the resultant films was examined for hydrogen content, fluorine content, and the average size of crystal grains in the film in the same manner as above described.

The results are shown in Table 17.

EXAMPLE 15

There was prepared a pin heterojunction photovoltaic element of the configuration shown in FIG. 1(A)-(Element Sample No. 15) by repeating the procedures of Example 8, except that the i-type semiconductor layer 104 was formed of a 3500 Å thick non-doped i-type a-SiC:H semiconductor film which was prepared by the foregoing process (3) by the plasma CVD method practiced in the plasma CVD apparatus shown in FIG. 4 under the conditions shown in Table 23.

The characteristics of Element Sample 15 as a solar cell were evaluated in the same manner as in Example 1.

The results obtained are shown in Table 17.

Besides the foregoing, using two quartz glass plates, there were formed an n-type poly-GaP:H:F:Se semiconductor film and a p-type poly-GaP:H:F:Zn semiconductor film separately by repeating the foregoing procedures for the formation of the n-type semiconductor layer 103 and the formation of the p-type semiconductor layer 105.

Each of the resultant films was examined for hydrogen content, fluorine content, and the average size of crystal grains in the film in the same manner as above described.

The results are shown in Table 17.

EXAMPLE 16

There was prepared a pin heterojunction photovoltaic element of the configuration shown in FIG. 1(A)-(Element Sample No. 16) by repeating the procedures of Example 8, except that the i-type semiconductor layer 104 was formed of a 3500 Å thick non-doped i-type a-Si:F semiconductor film which was prepared by the foregoing process (2) by the the reactive sputtering method practiced in the reactive sputtering apparatus shown in FIG. 3 under the conditions shown in Table 24.

The characteristics of Element Sample 16 as a solar cell were evaluated in the same manner as in Example 1.

The results obtained are shown in Table 17.

Besides the foregoing, using two quartz glass plates, there were formed an n-type poly-GaP:H:F:Se semiconductor film and a p-type poly-GaP:H:F:Zn semiconductor film separately by repeating the foregoing procedures for the formation of the n-type semiconductor layer 103 and the formation of the p-type semiconductor layer 105.

Each of the resultant films was examined for hydrogen content, fluorine content, and the average size of crystal grains in the film in the same manner as above described.

The results are shown in Table 17.

EXAMPLE 17

There was prepared a pin heterojunction photovoltaic element of the configuration shown in FIG. 1(A)-(Element Sample No. 17) by repeating the procedures of Example 8, except that the i-type semiconductor layer 104 was formed of a 3500 Å thick non-doped i-type a-Si:GeC:H semiconductor film which was prepared by the foregoing process (3) by the the Plasma CVD method practiced in the plasma CVD apparatus shown in FIG. 4 under the conditions shown in Table 25.

The characteristics of Element Sample 17 as a solar cell were evaluated in the same manner as in Example 1.

The results obtained are shown in Table 17.

Besides the foregoing, using two quartz glass plates, there were formed an n-type poly-GaP:H:F:Se semiconductor film and a p type poly-GaP:H:F:Zn semiconductor film separately by repeating the foregoing procedures for the formation of the n-type semiconductor layer 103 and the formation of the p-type semiconductor layer 105.

Each of the resultant films was examined for hydrogen content, fluorine content, and the average size of crystal grains in the film in the same manner as above described.

The results are shown in Table 17.

EXAMPLE 17

There was prepared a pin heterojunction photovoltaic element of the configuration shown in FIG. 1(A)-(Element Sample No. 17) by repeating the procedures of Example 8, except that the i-type semiconductor layer 104 was formed of a 3500 Å thick non-doped i-type a-Si:GeC:H semiconductor film which was prepared by the foregoing process (3) by the the Plasma CVD method practiced in the plasma CVD apparatus shown in FIG. 4 under the conditions shown in Table 25.

The characteristics of Element Sample 17 as a solar cell were evaluated in the same manner as in Example 1.

The results obtained are shown in Table 17.

Besides the foregoing, using two quartz glass plates, there were formed an n-type poly-GaP:H:F:Se semiconductor film and a p-type poly-GaP:H:F:Zn semiconductor film separately by repeating the foregoing procedures for the formation of the n-type semiconductor layer 103 and the formation of the p-type semiconductor layer 105.

Each of the resultant films was examined for hydrogen content, fluorine content and the average size of crystal grains in the film in the same manner as above described.

The results are shown in Table 17.

EXAMPLE 18

There was prepared a pin heterojunction photovoltaic element of the configuration shown in FIG. 1(A)-(Element Sample No 18) by repeating the procedures of Example 8, except that the i-type semiconductor layer 104 was formed of a 3500 Å thick non-doped i-type poly-Si:H semiconductor film which was prepared by the foregoing process (2) by the the reactive sputtering method to be practiced in the reactive sputtering apparatus shown in FIG. 3 under the conditions shown in Table 26.

The characteristics of Element Sample 18 as a solar cell were evaluated in the same manner as in Example 1.

The results obtained are shown in Table 17.

Besides the foregoing, using two quartz glass plates, these were formed an n-type poly-GaP:H:F:Se semiconductor film and a p-type poly-GaP:H:F:Zn semiconductor film on separately by repeating the foregoing procedures for the formation of the n-type semiconductor layer 103 and the formation of the p-type semiconductor layer 105.

The resultant films were examined for hydrogen content, fluorine content, and the average size of crystal grains in the film in the same manner as above described.

The results are shown in Table 17.

EXAMPLE 19

There was prepared a pin heterojunction photovoltaic element of the configuration shown in FIG. 1(B)(Element Sample No. 19) in accordance with the manner of Example 1 and the manner of Example 1.

That is, as the substrate 101, there was used a Corning glass plate No. 7059 of 50 mm by 50 mm in size. On the substrate an ITO thin film of about 500 Å in thickness as the transparent electrode 106 was formed by the resistance heating method.

On the foregoing transparent electrode was formed a 200 Å thick p-type a-Si:H:F:B semiconductor film as the p-type semiconductor layer 105 by repeating the procedures of forming the n-type layer in Example 1, except that $BF_3$ gas diluted with $H_2$ gas to 4000 ppm ($BF_3/H_2$ gas) was introduced into the film-forming chamber at a flow rate of 35 sccm in stead of the $PH_3/SiF_4$ gas. On this p-type semiconductor layer was formed a 3500 Å thick non-doped i-type a-Si:H:F film as the i-type semiconductor layer 104 by repeating the procedures for forming the i-type semiconductor layer in Example 1. There was then formed a 400 Å thick n-type poly-GaP:H:F:Se semiconductor film as the n-type semiconductor layer 103 on the i-type semiconductor layer 104 by repeating the procedures for forming the n-type semiconductor layer in Example 8. On this n-type semiconductor was formed a 0.5 μm thick Ag film as the electrode 102. Thus there was obtained Element Sample No. 19. The characteristics of Element Sample No. 19 as a solar cell were evaluated in the same manner as in Example 1.

The results obtained are shown in Table 27.

Besides the foregoing, using a quartz glass plate, there was formed an n-type poly-GaP:H:F:Se semiconductor film on the quartz glass plate by repeating the foregoing procedures for the formation of the n-type semiconductor layer 103.

The resultant film was examined for hydrogen content, fluorine content, and the average size of crystal grains in the film in the same manner as above described.

The results are shown in Table 27.

EXAMPLE 20

There was prepared a pin heterojunction photovoltaic element of the configuration shown in FIG. 1(B)(Element Sample No. 20) basically in accordance with the manner of Example 8.

That is, as the substrate 101, there was used a Corning glass plate No. 7059 of 50 mm by 50 mm in size. On the substrate an ITO thin film of about 500 Å in thickness as the transparent electrode 106 was formed by the resistance heating method. The procedures of forming the n-type semiconductor layer in Example 11 were repeated to form a 200 Å thick p-type a-SiC:H:F:B semiconductor film as the p-type semiconductor layer 105 on the transparent electrode, except that BF₃ gas diluted with H₂ gas to 4000 ppm (BF₃/H₂ gas) was introduced into the film-forming chamber at a flow rate of 30 sccm instead of the PH₃/H₂ gas Then, the procedures for forming the i-type semiconductor layer in Example 1 were repeated to form a 3500 Å thick non-doped i-type a-Si:H:F film as the i-type semiconductor layer 104 on the p-type semiconductor layer. Successively, there was formed a 400 Å thick n-type poly-GaP:H:F:Se semiconductor film as the n-type semiconductor layer 103 on the i-type semiconductor laye 104 by repeating the procedures of forming the n-type semiconductor layer in Example 8. On this n-type semiconductor was formed a 0.5 μm thick Ag film as the electrode 102. Thus there was obtained Element Sample No. 20. The characteristics of Element Sample No. 20 as a solar cell were evaluated in the same manner as in Example 1.

The results obtained are shown in Table 27.

Besides the foregoing, using a quartz glass plate, there was formed an n-type poly-GaP:H:F:Se semiconductor film on the quartz glass plate by repeating the foregoing procedures for the formation of the n-type semiconductor layer 103.

The resultant film was examined for hydrogen content, fluorine content, and the average size of crystal grains in the film in the same manner as above described.

The results are shown in Table 27.

EXAMPLE 21

There was prepared a pin heterojunction photovoltaic element of the configuration shown in FIG. 1(B)(Element Sample No. 21) basically in accordance with the manner of Example 1 and the manner of Example 8.

That is, as the substrate 101, there was used a Corning glass plate No. 7059 of 50 mm by 50 mm in size. On the substrate an ITO thin film of about 500 Å in thickness as the transparent electrode 106 was formed by the resistance heating method. On the transparent electrode was formed a 200 Å thick p-type ZnTe:P semiconductor film as the p-type semiconductor layer 105 by the foregoing process (2) by the reactive sputtering method practiced in the reactive sputtering apparatus shown in FIG. 3 under the conditions shown in Table 28. Then, the procedures for forming the i-type semiconductor layer in Example 1 were repeated to form a 3500 Å thick non-doped i-type a-Si:H:F film as the i-type semiconductor layer 104 on the p-type semiconductor layer. Successively, there was formed a 400 Å thick n-type poly-GaP:H:F:Se semiconductor film as the n-type semiconductor layer 103 on the i-type semiconductor layer 104 by repeating the procedures of forming the n-type semiconductor layer in Example 8. On this n-type semiconductor was formed a 0.5 μm thick Ag film as the electrode 102. Thus there was obtained Element Sample No. 21. The characteristics of Element Sample No. 21 as a solar cell were evaluated in the same manner as in Example 1.

The results obtained are shown in Table 27.

Besides the foregoing, using a quartz glass plate, there was formed an n-type poly-GaP:H:F:Se semiconductor film on the quartz glass plate by repeating the foregoing procedures for the formation of the n-type semiconductor layer 103.

The resultant film was examined for hydrogen content, fluorine content, and the average size of crystal grains in the film in the same manner as above described.

The results are shown in Table 27.

EXAMPLE 22

There was prepared a pin heterojunction photovoltaic element of the configuration shown in FIG. 1(B)(Element Sample No. 22) basically in accordance with the manner of Example 1 and the manner of Example 8.

That is, as the substrate 101, there was used a Corning glass plate No. 7059 of 50 mm by 50 mm in size. On the substrate was formed an ITO thin film of about 500 Å in thickness as the transparent electrode 106 by the resistance heating method.

On the transparent electrode was formed a 200 Å thick p-type GaP:Zn semiconductor film as the p-type semiconductor layer by the foregoing process (2) by the reacting sputtering method practiced in the reactive sputtering apparatus shown in FIG. 3 under the conditions shown in 29. Then, the procedures for forming the i-type semiconductor layer in Example 1 were repeated to form a 3500 Å thick non-doped i-type a-Si:H:F film as the i-type semiconductor layer 104 on the p-type semiconductor layer. Successively, there was formed a 400 Å thick n-type poly-GaP:H:F:Se semiconductor film as the n-type semiconductor layer 103 on the i-type semiconductor laye 104 by repeating the procedures of forming the n-type semiconductor layer in Example 8. On this n-type semiconductor was formed a 0.5 um thick Ag film as the electrode 102. Thus there was obtained Element Sample No. 22. The characteristics of Element Sample No. 22 as a solar cell were evaluated in the same manner as in Example 1.

The results obtained are shown in Table 27.

Besides the foregoing, using a quartz glass plate, there was formed an n-type poly-GaP:H:F:Se semiconductor film on the quartz glass plate by repeating the foregoing procedures for the formation of the n-type semiconductor layer 103.

The resultant film was examined for hydrogen content, fluorine content, and the average size of crystal grains in the film in the same manner as above described.

The results are shown in Table 27.

EXAMPLE 23

There was prepared a multi-cell tandem stacked pin heterojunction photovoltaic element of the configuration shown in FIG. 1(C)(Element Sample 23) which comprises three cells stacked in the following manner.

As the substrate 101, there was used a stainless plate of 50 mm by 50 mm in size.

Firstly, on the substrate was formed a 1000 Å thick Ag thin film as the lower electrode 102 in the same manner as in Example 1.

On the lower electrode was then formed a pin heterojunction photovoltaic element as the first cell 111 comprising a 400 Å thick n-type a-Si:H:F:P semiconductor film as the n-type semiconductor layer, a 3500 Å thick non-doped i-type a-SiGe:H:F semiconductor film as the i-type semiconductor layer 104 and a 200 Å thick p-type poly-GaP:H:F:Zn semiconductor film as the p-type semiconductor layer 105 by repeating the procedures of Example 5. Then, a second pin heterojunction photovoltaic element as the second cell 112 comprising a 400

Å thick n-type a-Si:H:F:P semiconductor film as the n-type semiconductor layer 114, a 3000 Å thick i-type non-doped a-Si:H:F film as the i-type semiconductor layer 115 and a 200 Å thick p-type poly-GaP:H:F:Zn semiconductor film as the p-type semiconductor layer 116 was formed on the first cell 111 by repeating the procedures of Example 1. On the second cell 112 there was formed a pin heterojunction photovoltaic element as the third cell 113 comprising a 400 Å thick n-type a Si:H:F:P semiconductor film as the n-type semiconductor layer 117, a 2500 Å thick non-doped i-type a-SiC:H:F semiconductor film as the i-type semiconductor layer 118 and a 200 Å thick p-type poly-GaP:H:F:Zn semiconductor film as the p-type semiconductor layer 119 by repeating the procedures of Example 4. On the p-type semiconductor layer 119 of the third cell 113 there was formed a 700 Å ITO film as the transparent parent electrode 106 in the same manner in Example 1. On the transparent electrode, there was formed a comb-shaped film comprising an Ag thin film of 0.8 μm in thickness as the collecting electrode 107 by repeating the procedures of forming the comb-shaped collecting electrode in Example 1. Thus there was obtained Element Sample No. 23. The characteristics of Element Sample No. 23 as a solar cell were evaluated in the same manner as in Example 1.

The results obtained are shown in Table 30.

COMPARATIVE EXAMPLE 1

There was prepared a comparative pin heterojunction photovoltaic element of the configuration shown in FIG. 1(A)(Element Sample No. 24) by repeating the procedures of Example 1, except that the p-type semiconductor layer 105 was formed of a 200 Å thick p-type a-Si:H:F:B semiconductor film which was prepared in the following manner.

That is, after the i-type semiconductor layer 104 was formed, the substrate was moved by the substrate transfer unit through the gate valve to the other film-forming chamber having the same constitution as that of the film-forming chamber 201. The gate valve was closed and the film-forming chamber was evacuated to and maintained at $1 \times 10^{-5}$ Torr or below. The substrate was then heated to 220° C. by actuating the heater 205 and it was maintained at this temperature. Thereafter, $Si_2F_6$ gas and $BF_3$ gas diluted with $SiF_4$ gas to 4000 ppm ($BF_3/SiF_4$ gas) were introduced through the gas supply pipe 214 into the activation chamber 208 maintained at 700° C. by the activation energy generation means 211 at respective flow rates of 30 sccm and 8 sccm while being mixed to generate precursors containing fluorine radicals, which were successively introduced through the transport conduit 217 into the film-forming chamber 201.

At the same time, He gas and $H_2$ gas were introduced through the gas supply pipe 215 into the activation chamber 209 at respective flow rates of 120 sccm and 60 sccm while being mixed, into which microwave power (2.45 GHz) of 320W was applied to generate hydrogen radicals, which were successively introduced through the transport conduit 218 into the film-forming chamber 201. At this time, the inner pressure of the film-forming chamber 201 was maintained at 0.35 Torr. The foregoing precursors and hydrogen radicals thus introduced into the film-forming chamber 201 were chemically reacted to form a 200 Å thick p-type a-Si:H:F:B semiconductor film as the p-type semiconductor layer 105 on the i-type semiconductor layer 104. On this p-type semiconductor were successively formed a 700 Å thick ITO film as the transparent electrode 106 and an 0.8 μm thick comb-shaped film comprising an 0.8 μm thick Ag film as the collecting electrode 107 respectively in the same manner as in Example 1.

Thus there was obtained Element Example No. 24 for comparison purposes.

The characteristics of Element Sample No. 24 as a solar cell were evaluated in the same manner as in Example 1.

The results obtained were shown in Table 31.

COMPARATIVE EXAMPLE 2

There was prepared a comparative pin heterojunction photovoltaic element of the configuration shown in FIG. (A)(Element Sample No. 25) by repeating the procedures of Example 1, except that the p-type semiconductor layer 105 was formed of a 200 Å thick p-type poly-GaP:F:Zn semiconductor film which was prepared by repeating the procedures of forming the p-type semiconductor layer in Example 1, except that $H_2$ gas was not used.

Likewise, there was separately prepared another comparative pin heterojunction photovoltaic element of the configuration shown in FIG. 1(A)(Element Sample No. 26) by repeating the procedures of Example 1, except that the p-type semiconductor layer 105 was formed of a 200 Å thick p-type poly-GaP:H:F:Zn semiconductor film (wherein the hydrogen content is slight) which was prepared by repeating the procedures of Example 1, except for changing the flow rate of the $H_2$ gas to 0.5 sccm.

The characteristics of each of Element Samples Nos. 25 and 26 as solar cell were evaluated in the same manner as in Example 1.

The results obtained are shown in Table 31.

Besides the foregoing, using a quartz glass plate, there was formed each of the foregoing two p-type semiconductor films on the quartz glass plate by repeating the respective foregoing procedures for the formation of the p-type semiconductor layer 105.

Each of the resultant films was examined for hydrogen content, fluorine content, and the average size of crystal grains in the film in the same manner as above described.

The results are shown in Table 31.

COMPARATIVE EXAMPLE 3

There was prepared a comparative pin heterojunction photovoltaic element of the configuration shown in FIG. 1(A)(Element Sample No. 27) by repeating the procedures of Example 1, except that the flow rate of the raw material gas containing $Ga(CH_3)_2/Zn(CH_3)_2 = 10^4:1$ and the flow rate of the $PF_5$ gas at the time of forming the p-type semiconductor layer were changed respectively to $5.0 \times 10^{-4}$ mol/min and 15 sccm.

The characteristics of Element Sample No. 27 as a solar cell were evaluated in the same manner as in Example 1.

The results obtained are shown in Table 31.

Besides the foregoing, using a quartz glass plate, there was formed the foregoing p-type semiconductor film on the quartz glass plate by repeating the foregoing procedures for the formation of the p-type semiconductor layer 105.

The resultant film was examined for hydrogen content, fluorine content, and the average size of crystal grains in the film in the same manner as above described.

The results are shown in Table 31.

COMPARATIVE EXAMPLE 4

There were prepared three kinds of comparative pin heterojunction photovoltaic elements of the configuration shown in FIG. 1(A)(Element Samples Nos. 28, 29 and 30) by repeating the procedures of Example 1, except that the i-type semiconductor layer 104 was formed of a 3500 Å thick non-doped i-type a-Si film, a-SiC film or a-SiGe film prepared by the foregoing process (2) by the reactive sputtering apparatus shown in FIG. 2 under the conditions shown in Table 32.

The characteristics of each of Element Samples Nos. 28, 29 and 30 as a solar cell were evaluated in the same manner as in Example 1.

The results obtained are shown in Table 31.

Besides the foregoing, using a quartz glass plate, there was formed each of the p-type poly-GaP:H:F:Zn semiconductor films on the quartz glass plate by repeating the foregoing procedures for the formation of the p-type semiconductor layer 105.

Each of the resultant films was examined for hydrogen content, fluorine content, and the average size of crystal grains in the film in the same manner as above described.

The results are shown in Table 31.

COMPARATIVE EXAMPLE 5

There was prepared a comparative multi-cell tandem stacked pin heterojunction photovoltaic element of the configuration shown in FIG. 1(C)(Element Sample 31) by repeating the procedures of Example 23, except that the p-type semiconductor layer 119 of the third cell 113 was formed of a 200 Å thick p-type a-Si:H:F:B film by repeating the procedures of forming the p-type semiconductor layer in Comparative Example 1.

The characteristics of Element Sample 31 were evaluated in the same manner as in Example 1. The results obtained are shown in Table 30.

Observations on the Results Shown in Tables 9, 17, 27, 30 and 31

In each of Tables 9, 17, 27, 30 and 31, with respect to characteristic properties required for a pin heterojunction photovoltaic element, there are indicated the following evaluation items: (a) open-circuit voltage (Voc) which is generated when the element is irradiated with AM-1 light (100 mW/cm$^2$), (b) short-circuit current (Isc) which is generated when the element is irradiated with AM-1 light (100 mW/cm$^2$), and (c) the relative value of the output which is obtained when the element is irradiated with AM-1 light through a 400 nm interference filter versus the output which is obtained when the pin heterojunction photovoltaic element prepared in Comparative Example 1 is irradiated through the interference filter.

In each of Tables 9, 17, 27 and 31, there are also shown the content of hydrogen atoms (H), the content of optional fluorine atoms (F), the average grain size, and the composition ratio of the Ga to the P with respect to each of the poly-GaP:H(F):M semiconductor films used.

The results indicate the following. It has been recognized that each of the pin heterojunction photovoltaic elements of the configuration shown in FIG. 1(A) or FIG. 1(B) (Element Samples Nos. 1–22 obtained in Examples 1 to 22) having the p-type semiconductor layer or/and the n-type semiconductor layer formed of a specific poly-GaP:H(F):M semiconductor film of wide band gap (where M is a dopant of p-type or n-type) according to the present invention which contains gallium atoms (Ga) and phosphorous atoms (P) in uniformly distributed states with the composition ratio of the Al to the P to satisfy the stoichiometric ratio, hydrogen atoms (H) in an amount of 0.5 to 5 atomic %, optionally fluorine atoms (F) in an amount of 0 to 3 atomic %, and crystal grains of an average size in the range of from 50 to 1000 Å and the i-type semiconductor layer of a specific silicon (Si)-containing non-single crystal film containing at least hydrogen atoms (H) and/or fluorine atoms (F) excels in any of the evaluation items required for a solar cell. It has been also recognized that the specific poly-GaP:H(F):M semiconductor film according to the present invention makes it possible to form a desirable junction with a specific silicon(Si)-containing non-single crystal semiconductor film regardless of its band gap whether it is wide or narrow and thus, it makes possible to provide a desirable pin heterojunction photovoltaic element excelling in the characteristics required for a solar cell. This situation is apparent when the characteristics of each of these pin heterojunction photovoltaic elements (Element Samples Nos. 1 to 22) as a solar cell are compared with those of each of the comparative pin junction photovoltaic elements of the configuration shown in FIG. 1(A) (Element Samples Nos. 24 to 30 obtained in Comparative Examples 1 to 4). More particularly in this respect, it has been recognized that the pin heterojunction photovoltaic elements (Element Samples 1 to 3 prepared in Examples 1 to 3, respectively) in which the p-type semiconductor layer comprises the foregoing specific poly-GaP:H(F):Mp semiconductor film (where Mp is a p-type dopant) prepared by a different film-forming method, the i-type semiconductor layer comprising the foregoing selected Si-containing non-single crystal film (a-Si:H:F film) and the n-type semiconductor layer comprising an n-type non-single crystal Si-containing film (n-type a-Si:H:F film) markedly surpass the comparative pin photovoltaic element (Element Sample No. 24 prepared in Comparative Example 1) which has the p-type semiconductor layer comprising a p-type a-Si:H:F film, the i-type semiconductor layer comprising an i-type a-Si:H:F film and the n-type semiconductor layer comprising an n-type a-Si:H:F film, with respect to any of the foregoing evaluation items (a) to (c) without depending upon the kind of the method employed for forming said poly-GaP:H(F):Mp semiconductor film.

For the pin heterojunction photovoltaic elements (Element Samples Nos. 4, 5 and 6 prepared respectively in Examples 4, 5 and 6) respectively comprising a p-type semiconductor layer formed of the foregoing poly-GaP:H(F):Mp semiconductor film, an i-type semiconductor layer formed of an i-type a-SiC:H:F film, an i-type a-SiGe:H:F film or an i-type poly-Si:H:F film and an n-type semiconductor layer formed of an n-type a-Si:H:F film, it has been recognized that any of them still excels in any of the evaluation items (a) to (c) although the i-type semiconductor layer is formed of a Si-containing non-single crystal film other than the i-type a-Si:H:F film, i.e. said i-type a-SiC:H:F film, i-type a-SiGe:H:F film or i-type poly-Si:H:F film.

From the results of the pin heterojunction photovoltaic element (Element Sample No. 7 prepared in Example 7), it has been recognized that the present invention is markedly effective also in the case of the pin heterojunction photovoltaic element of the type wherein light is impinged from the side of the substrate. In fact, as Table 9 illustrates, the pin heterojunction photovoltaic element of the configuration shown in FIG. 1(B) which comprises the p-type semiconductor layer formed of p-type a-Si:H:F, the i-type semiconductor layer formed of i-type a-Si:H:F film and the n-type semiconductor layer formed of the foregoing poly-GaP:H(F):Mn film (where Mn is an n-type dopant) markedly excels in each of the foregoing evaluation items (a) to (c).

From the results shown in Table 9 for the pin heterojunction photovoltaic element (Element Sample No. 8 prepared in Example 8) which comprises a p-type semiconductor layer formed of the foregoing poly-GaP:H(F):Mp semiconductor film, an i-type semiconductor layer formed of an i-type a-Si:H:F film and an n-type semiconductor layer formed of the foregoing poly-GaP:H(F):Mn semiconductor film, it has been recognized that Element Sample No. 8 surpasses any of Element Samples 1 to 3 with respect to all the foregoing evaluation items (a) to (c).

On the other hand, for the two comparative pin heterojunction photovoltaic elements (Element Samples Nos. 25–26 prepared in Comparative Example 2), it has been recognized that each of them apparently is inferior to each of Element Samples Nos. 1–3 chiefly because each of them has a p-type semiconductor layer formed of a p-type poly-GaP:F semiconductor film not containing hydrogen atoms or a p-type poly-GaP:H:F semiconductor film containing hydrogen atoms only in a slight amount.

Likewise, for the comparative pin heterojunction photovoltaic element (Element Sample No. 27 prepared in Comparative Example 3), it has been recognized that it is apparently inferior to each of Element Samples Nos. 1 to 3 chiefly because of having a p-type semiconductor layer formed of a p-type poly-GaP:H:F film containing gallium atoms (Ga) and phosphorus atoms (P) with a composition ratio which does not satisfy the stoichiometric ratio.

For the three comparative pin heterojunction photovoltaic elements (Element Samples Nos. 28–30), it has been recognized that each of them is apparently inferior to each of Element Samples Nos. 3–5 although each of them has a p-type semiconductor layer formed of the foregoing poly-GaP:H:F:Mp semiconductor film but it has the i-type semiconductor layer formed of an i-type a-Si film, a-SiC film or a-SiGe film containing neither hydrogen atoms (H) nor fluorine atoms (F).

For the pin heterojunction photovoltaic elements (Element Samples Nos. 9–12 prepared in Examples 9–12) respectively having a p-type semiconductor layer formed of the foregoing poly-GaP:H(F):Mp semiconductor film, an i-type semiconductor layer formed of an i-type a-Si:H:F film and an n-type semiconductor layer formed of an n-type non-single crystal film other than the n-type a-Si:H:F film, i.e. an n-type GaP film of wide band gap, an n-type a-SiGe:H:F film of narrow band gap, an n-type a-SiC:H:F film of wide band gap or an n-type GaAs film of narrow band gap, it has been recognized that each of them provides a high Voc and a desirable Isc, and exhibits good, practically applicable solar cell characteristics.

For the pin heterojunction photovoltaic elements (Element Samples Nos. 13–18 prepared in Examples 13–18) respectively having a p-type semiconductor layer formed of the foregoing poly-GaP:H(F):Mp semiconductor film, an i-type semiconductor layer formed of an i-type Si-containing non-single crystal film other than the i-type a-Si:H:F film, i.e. an i-type a-Si:H film, an i-type a-SiGe:H film of narrow band gap, an i-type a-SiC:H film of wide band gap, an i-type a-Si:F film, an i-type a-Si:Ge:C:H film of wide band gap or an i-type poly-Si:H film of narrow band gap, and an n-type semiconductor layer formed of the foregoing poly-GaP:H(F): Mn semiconductor film, it has been recognized that each of them provides a high Voc and a desirable Isc, and exhibits good, practically applicable solar cell characteristics.

For the pin heterojunction photovoltaic elements (Element Samples Nos. 19–22 prepared in Examples 19–22) of the configuration shown in FIG. 1(B) respectively having a p-type semiconductor layer formed of a p-type a-Si:H:F film, a p-type a-SiC:H:F film of wide band gap, a p-type ZnTe film of wide band gap or a p-type GaP film of wide band gap, an i-type semiconductor layer formed of an i-type a-Si:H:F film and an n-type semiconductor layer formed of the foregoing poly-GaP:H(F):Mn semiconductor film, it has been recognized that each of them provides a high Voc and a desirable Isc, and exhibits good, practically applicable solar cell characteristics.

For each of the multi-cell tandem stacked pin heterojunction photovoltaic elements of the configuration shown in FIG. 1(c)(Element Samples Nos. 23 and 31 prepared in Examples 21 and Comparative Example 5), evaluations were made for the Voc and the Isc and in addition, for the change in photoelectric conversion efficiency that takes place after continuous irradiation with AM-1 light for 10 hours: the change is expressed by $\Delta\eta/\eta_o$ in percentage, where $\Delta\eta$ is the amount of change in photoelectric conversion efficiency and $\eta_o$ is the initial photoelectric conversion efficiency as shown in Table 30.

From the results shown in Table 30, it has been recognized that (1) the multi-cell tandem stacked pin heterojunction photovoltaic element in which the p-type semiconductor layer of each cell is formed of the foregoing poly-GaP:H(F):Mp semiconductor film (Element Sample No. 23) is superior to the comparative multi-cell tandem stacked pin heterojunction photovoltaic element (Element Sample No. 31) in which the p-type semiconductor layer of each cell is formed of a p-type a-Si:H:F film with respect to any of the Voc and the Isc. It has been also recognized that the change in photoelectric conversion efficiency of Element Sample No. 23 is significantly smaller than that of Element Sample No. 31. This means that Element Sample No. 23 not only excels in the initial solar cell characteristics but also can be continuously used as a solar cell for a long period of time without being deteriorated.

TABLE 1 substrate temperature: 220° C.
inner pressure: 80 mTorr

| raw material gas (A): | gasified Ga(CH$_3$)$_3$ at | decomposed with |
|---|---|---|
| (introduced into | 2.5 × 10$^{-4}$ mol/min | microwave (2.45 GHz) |
| the activation | He gas (carrier gas) | of 50 W |
| chamber 208) | at 15 sccm | |

TABLE 1-continued

| | | |
|---|---|---|
| raw material gas (B): (introduced into the activation chamber 210) | $PF_5$ gas at 5 sccm | thermally decomposed at 500° C. |
| raw material gas (C): (introduced into the activation chamber 209) | $H_2$ gas* at 0~800 sccm, He gas at 40 sccm | decomposed with microwave (2.45 GHz) of 200 W | the distance between the substrate and the outlet
of the transportation conduit for H radicals: 8 cm
*Sample No. and the flow rate of $H_2$ gas

| | |
|---|---|
| Sample No. 1 | 0 sccm |
| Sample No. 2 | 0.2 sccm |
| Sample No. 3 | 1.0 sccm |
| Sample No. 4 | 3.0 sccm |
| Sample No. 5 | 10 sccm |
| Sample No. 6 | 20 sccm |
| Sample No. 7 | 50 sccm |
| Sample No. 8 | 100 sccm |
| Sample No. 9 | 400 sccm |
| Sample No. 10 | 800 sccm |

TABLE 2

| Sample No. | hydrogen content (atomic %) | fluorine content (atomic %) | composition ratio of Ga to P | distributed state of crystal grain | crystal orientation | average crystal grain size (Å) |
|---|---|---|---|---|---|---|
| 1 | not detected | 6.4 | 34:66 | uneven (localized) | random | — |
| 2 | 0.3 | 2.7 | 42:58 | " | " | — |
| 3 | 2.6 | 2.2 | 47:53 | even | <111> | 50 |
| 4 | 3.3 | 1.9 | 49:51 | " | " | 200 |
| 5 | 4.3 | 1.4 | 49:51 | " | " | 600 |
| 6 | 4.6 | 1.2 | 50:50 | " | " | 850 |
| 7 | 5.0 | 0.9 | 51:49 | " | " | 1000 |
| 8 | 4.5 | 0.8 | 51:49 | " | " | 800 |
| 9 | 3.2 | 0.3 | 52:48 | " | " | 750 |
| 10 | 2.4 | 0.05 | 55:45 | " | " | 600 |

TABLE 3

| | |
|---|---|
| target material: | non-doped polycrystal GaP wafer |
| sputtering gas used: | Ar gas at 50 sccm |
| and its flow rate | $H_2$ gas* at 0~500 sccm |
| | HF gas* at 0~100 sccm | the distance between the target and the substrate: 40 mm
high frequency power: 400 W (13.56 MHz)
substrate temperature: 220° C.
inner pressure: 5 mTorr
*Sample No. and the flow rates of $H_2$ gas and HF gas

| | $H_2$ | HF |
|---|---|---|
| Sample No. 11 | 0 sccm | 0 sccm |
| Sample No. 12 | 1 sccm | 1 sccm |
| Sample No. 13 | 5 sccm | 0 sccm |
| Sample No. 14 | 5 sccm | 5 sccm |
| Sample No. 15 | 10 sccm | 5 sccm |
| Sample No. 16 | 50 sccm | 10 sccm |
| Sample No. 17 | 50 sccm | 50 sccm |
| Sample No. 18 | 100 sccm | 50 sccm |
| Sample No. 19 | 100 sccm | 100 sccm |
| Sample No. 20 | 500 sccm | 50 sccm |

TABLE 5

| | |
|---|---|
| raw material gas (A): | gasified $Ga(CH_3)_3$ at $5.0 \times 10^{-5}$ mol/min |
| | He gas (carrier gas) at 10 sccm |
| raw material gas (B): | $PH_3$ gas at 3 sccm |
| raw material gas (C): | $H_2$ gas* at 0~800 sccm |
| | HF gas* at 0~100 sccm | the distance between the substrate and the cathode: 35 mm
high frequency power: 80 W (13.56 MHz)
substrate temperature: 230° C.
inner pressure: 0.6 Torr
*Sample No. and the flow rate of $H_2$ gas and HF gas

| | $H_2$ | HF |
|---|---|---|
| Sample No. 21 | 0 sccm | 0 sccm |
| Sample No. 22 | 5 sccm | 0 sccm |
| Sample No. 23 | 5 sccm | 5 sccm |
| Sample No. 24 | 50 sccm | 50 sccm |
| Sample No. 25 | 100 sccm | 50 sccm |
| Sample No. 26 | 100 sccm | 100 sccm |
| Sample No. 27 | 300 sccm | 50 sccm |
| Sample No. 28 | 500 sccm | 50 sccm |
| Sample No. 29 | 800 sccm | 50 sccm |
| Sample No. 30 | 800 sccm | 100 sccm |

TABLE 4

| Sample No. | hydrogen content (atomic %) | fluorine content (atomic %) | composition ratio of Ga to P | distributed state of crystal grain | crystal orientation | average crystal grain size (Å) |
|---|---|---|---|---|---|---|
| 11 | not detected | not detected | 45:55 | fairly uneven | random | — |
| 12 | 0.1 | 0.05 | 47:53 | " | <111> | 40 |
| 13 | 0.5 | not detected | 48:52 | even | " | 50 |
| 14 | 0.8 | 0.1 | 49:51 | " | " | 200 |
| 15 | 1.0 | 0.4 | 50:50 | " | " | 400 |
| 16 | 3.8 | 1.5 | 51:49 | " | " | 750 |
| 17 | 4.1 | 2.5 | 51:49 | " | " | 850 |
| 18 | 4.8 | 3.0 | 52:48 | " | " | 700 |
| 19 | 6.2 | 4.3 | 54:46 | " | " | 650 |
| 20 | 7.0 | 2.0 | 51:49 | " | " | 700 |

TABLE 6

| Sample No. | hydrogen content (atomic %) | fluorine content (atomic %) | composition ratio of Ga to P | distributed state of crystal grain | crystal orientation | average crystal grain size (Å) |
|---|---|---|---|---|---|---|
| 21 | 25 | not detected | 46:54 | uneven (localized) | amorphous | — |
| 22 | 15 | not detected | 47:53 | " | " | — |
| 23 | 10 | 0.5 | 49:51 | fairly uneven | " | — |
| 24 | 6.0 | 1.2 | 49:51 | even | random | 30 |
| 25 | 4.6 | 1.1 | 49:51 | " | <111> | 100 |
| 26 | 4.8 | 2.1 | 51:49 | " | " | 200 |
| 27 | 3.5 | 1.2 | 50:50 | " | " | 350 |
| 28 | 2.8 | 1.3 | 51:49 | " | " | 550 |
| 29 | 2.6 | 1.2 | 49:51 | " | " | 400 |
| 30 | 3.2 | 2.2 | 51:49 | " | " | 350 |

TABLE 7

| Sample No. | change in the electric conductivity | photo-luminescence | surface smoothness | total evaluation |
|---|---|---|---|---|
| 1 | X | X | X | X |
| 2 | X | X | X | X |
| 3 | O | X | X | X |
| 4 | O | Δ | O | O |
| 5 | O | O | O | O |
| 6 | O | O | O | O |
| 7 | O | O | O | O |
| 8 | O | O | O | O |
| 9 | O | O | X | X |
| 10 | O | O | X | X |
| 11 | X | X | X | X |
| 12 | X | X | X | X |
| 13 | O | Δ | O | O |
| 14 | O | O | O | O |
| 15 | O | O | O | O |
| 16 | O | O | O | O |
| 17 | O | Δ | O | O |
| 18 | O | Δ | O | O |
| 19 | X | X | X | X |
| 20 | X | Δ | X | X |
| 21 | X | X | X | X |
| 22 | X | X | X | X |
| 23 | X | X | X | X |
| 24 | X | Δ | X | X |
| 25 | O | O | O | O |
| 26 | O | Δ | O | O |
| 27 | O | O | O | O |
| 28 | O | O | O | O |
| 29 | O | O | X | X |
| 30 | O | Δ | X | X |

Note
O: excellent
O: good
Δ: seems practically acceptable
X: practically not acceptable

TABLE 8

| Sample No. | p-type semiconductor | i-type semiconductor | n-type semiconductor | Isc | Voc |
|---|---|---|---|---|---|
| 91 | p-type GaP:H(F) | A-Si:H | A-Si:H | O | O |
| 92 | according to the | A-Si:F | | Δ | O |
| 93 | present | A-Si:H:F | | O | O |
| 94 | invention | A-Si:H | n-type GaP:H(F) | O | O |
| 95 | | A-Si:F | according to the | O | O |
| 96 | | A-Si:H:F | present | O | O |
| 97 | | A-SiC:H:F | invention | Δ | O |
| 98 | | A-SiGe:H:F | A-Si:H | O | Δ |
| 99 | | poly-Si:H:F | | Δ | Δ |
| 100 | | A-Si | A-Si:H | X | X |
| 101 | | A-SiC | | X | Δ |
| 102 | | A-SiGe | | X | X |
| 103 | | poly-Si | | Δ | X |
| 104 | known p-type GaP | A-Si:H | A-Si:H | Δ | Δ |
| 105 | | A-Si:F | | X | X |
| 106 | | A-Si:HF:F | | X | X |
| 107 | | A-SiC:H:F | | X | Δ |
| 108 | | A-SiGe:H:F | | X | X |
| 109 | | poly-Si:H:F | | X | Δ |

Note
O: excellent
O: good
Δ: seems practically acceptable
X: practically not acceptable

TABLE 9

| Example No. | Element Sample No. | semiconductor layer | characteristics of p-type GaP: H(F) film | | | | open-circuit voltage under irradiation of AM-1 light Voc [Volt] | short-circuit photocurrent under irradiation of AM-1 light Isc [mA/cm²] | output value under irradiation of AM-1 light (using 400 nm interference filter) [relative value] |
|---|---|---|---|---|---|---|---|---|---|
| | | | hydrogen content (atomic %) | fluorine content (atomic %) | average crystal grain size (Å) | composition ratio of Ga to P (atomic %) | | | |
| 1 | 1 | p-type GaP:H:F:(1) i-type A-Si:H:F n-type A-Si:H:F | 4.5 | 1.1 | 400 | 50:50 | 0.94 | 17.6 | 1.9 |
| 2 | 2 | p-type GaP:H:F(2) i-type A-Si:H:F | 2.5 | 1.2 | 500 | 51:49 | 0.95 | 17.4 | 1.8 |

TABLE 9-continued

| Example No. | Element Sample No. | semiconductor layer | characteristics of p-type GaP: H(F) film | | | | open-circuit voltage under irradiation of AM-1 light Voc [Volt] | short-circuit photocurrent under irradiation of AM-1 light Isc [mA/cm$^2$] | output value under irradiation of AM-1 light (using 400 nm interference filter) [relative value] |
| --- | --- | --- | --- | --- | --- | --- | --- | --- | --- |
| | | | hydrogen content (atomic %) | fluorine content (atomic %) | average crystal grain size (Å) | composition ratio of Ga to P (atomic %) | | | |
| 3 | 3 | n-type A-Si:H:F p-type GaP:H:F:(3) i-type A-Si:H:F n-type A-Si:H:F | 4.7 | 1.8 | 250 | 51:49 | 0.93 | 16.9 | 1.6 |
| 4 | 4 | p-type GaP:H:F i-type A-SiC:H:F n-type A-Si:H:F | 4.6 | 1.1 | 400 | 51:49 | 1.16 | 12.3 | 1.5 |
| 5 | 5 | p-type GaP:H:F i-type A-SiGe:H:F n-type A-Si:H:F | 4.5 | 1.0 | 400 | 50:50 | 0.61 | 20.6 | 1.4 |
| 6 | 6 | p-type GaP:H:F i-type polySi:H:F n-type A-Si:H:F | 4.6 | 1.1 | 400 | 51:49 | 0.56 | 18.4 | 1.1 |
| 7 | 7 | p-type A-Si:H:F i-type A-Si:H:F n-type GaP:H:F | 4.5 | 1.1 | 400 | 50:50 | 0.93 | 17.4 | 1.8 |
| 8 | 8 | p-type GaP:H:F i-type A-Si:H:F n-type GaP:H:F | 4.6 *4.4 | 1.0 *0.9 | 400 350 | 51:49 50:50 | 0.97 | 18.3 | 2.1 |

*n-type GaP:H:F film

TABLE 10

| | |
| --- | --- |
| target material: | non-doped GaP polycrystal wafer |
| substrate temperature: | 220° C. |
| flow rate of Ar gas: | 40 sccm |
| flow rate of H$_2$ gas: | 15 sccm |
| flow rate of HF gas: | 10 sccm |
| flow rate of DMZn gas as a carrier gas: | 3 × 10$^{-10}$ mole/min (He 5 sccm) |
| inner pressure: | 6 mTorr |
| high frequency power: | 400 W (13.56 MHz) |

TABLE 11

| | |
| --- | --- |
| substrate temperature: | 230° C. |
| raw material gas (A): | gasified Ga(CH$_3$)$_3$/Zn(CH$_3$)$_2$ = 10$^4$:1 at 6.0 × 10$^{-5}$ mol/min He gas (carrier gas) at 10 sccm |
| raw material gas (B): | PH$_3$ gas at 3.5 sccm |
| raw material gas (C): | H$_2$ gas at 120 sccm HF gas at 80 sccm |
| inner pressure: | 0.8 Torr |
| high frequency power: | 70 W (13.56 MHz) |
| the distance between the substrate and the cathode: | 35 mm |

TABLE 12

| | | |
| --- | --- | --- |
| raw material gas (A): (introduced into the activation chamber 208) | Si$_2$F$_6$ gas at 20 sccm | thermally decomposed at 700° C. |
| raw material gas (B): (introduced into the activation chamber 209) | H$_2$ gas at 120 sccm He gas at 80 sccm | decomposed with microwave (2.45 GHz) of 400 W |
| raw material gas (C): (introduced into the activation chamber 210) | CH$_4$ gas at 150 sccm He gas at 30 sccm | decomposed with microwave (2.45 GHz) of 300 W |
| substrate temperature: | 220° C. | |
| inner pressure: | 0.25 Torr | |
| the distance between the substrate and the outlet of the transportation conduit for H radicals: | 8 cm | |

TABLE 13

| | | |
| --- | --- | --- |
| raw material gas (A): (introduced into the activation chamber 208) | Si$_2$F$_6$ gas at 25 sccm | thermally decomposed at 700° C. |
| raw material gas (B): (introduced into the activation chamber 209) | H$_2$ gas at 100 sccm He gas at 60 sccm | decomposed with microwave (2.45 GHz) of 400 W |
| raw material gas (C): (introduced into the activation chamber 210) | GeF$_4$ gas at 5 sccm He gas at 25 sccm | thermally decomposed at 450° C. together with Ge solid particles |
| substrate temperature: | 220° C. | |
| inner pressure: | 0.15 Torr | |
| the distance between the substrate and the outlet of the transportation conduit for H radicals: | 10 cm | |

TABLE 14

| | | |
| --- | --- | --- |
| raw material gas (A): (introduced into the activation chamber 208) | Si$_2$F$_6$ gas at 15 sccm | thermally decomposed at 700° C. |
| raw material gas (B): (introduced into the activation chamber 209) | H$_2$ gas at 350 sccm He gas at 150 sccm | decomposed with microwave (2.45 GHz) of 450 W |
| substrate temperature: | 220° C. | |
| inner pressure: | 0.20 Torr | |
| the distance between the substrate and the outlet of the transportation conduit for H radicals: | 5 cm | |

TABLE 15

| | | |
| --- | --- | --- |
| raw material gas (A): (introduced into the activation chamber 208) | gasified Ga(CH$_3$)$_3$/ Se(CH$_3$)$_2$ = 10$^4$:1 at 4.0 × 10$^{-4}$ mol/min He gas at 15 sccm | decomposed with high frequency power (13.56 MHz) of 80 W |
| raw material gas (B): (introduced into the activation chamber 209) | H$_2$ gas at 7 sccm He gas at 60 sccm | decomposed with microwave (2.45 GHz) of 50 W |
| raw material gas (C): (introduced into the activation chamber 210) | PF$_5$ gas at 6 sccm | thermally decomposed at 500° C. |
| substrate temperature: | 220° C. | |

TABLE 15-continued

| | |
|---|---|
| inner pressure: | 0.7 Torr |
| the distance between the substrate and the outlet of the transportation conduit for H radicals: | 7 cm |

TABLE 16

Conditions for the preparation of n-type GaP film

| | |
|---|---|
| target material: | non-doped GaP polycrystal wafer |
| substrate temperature: | 220° C. |
| flow rate of Ar gas: | 50 sccm |
| flow rate of $Se(CH_3)_2$ saturated with He gas (as an n-type doping raw material gas: | $4 \times 10^{-11}$ mol/min |
| flow rate of He gas as a carrier gas: | 3 sccm |
| inner pressure: | 5.5 mTorr |
| high frequency power: | 350 W (13.56 MHz) |

TABLE 19

Conditions for the preparation of n-type A-SiC:H:F film

| | |
|---|---|
| substrate temperature: | 220° C. |
| flow rate of $SiF_4$ gas: | 25 sccm |
| flow rate of $CH_4$ gas: | 5 sccm |
| flow rate of $H_2$ gas: | 250 sccm |
| flow rate of $PH_3$ gas: (diluted by $H_2$ gas to 3000 ppm) | 21 sccm |
| inner pressure: | 1.1 Torr |
| high frequency power: | 45 W (13.56 MHz) |

TABLE 20

Conditions for the preparation of n-type GaAs film

| | |
|---|---|
| target material: GaAs polycrystal wafer | |
| substrate temperature: 220° C. | |
| flow rate of Ar gas: 50 sccm | |
| flow rate of $SiH_4$ gas: 6 sccm (diluted by Ar gas to 1000 ppm) | |
| inner pressure: 4 mTorr | |
| high frequency power: 360 W (13.56 MHz) | |

TABLE 17

| Example No. | Element Sample No. | semiconductor layer | characteristics of p-type & n-type GaP:H(F) film — hydrogen content (atomic %) | fluorine content (atomic %) | average crystal grain size (Å) | composition ratio of Ga to P | open-circuit voltage under iradiation of AM-1 light Voc [Volt] | short-circuit photocurrent under irradiation of AM-1 light Isc [mA/CM²] | output value under irradiation of AM-1 light (using 400 nm interference filter) [relative value] |
|---|---|---|---|---|---|---|---|---|---|
| 9 | 9 | p-type GaP:H:F<br>i-type A-Si:H:F<br>n-type GaP | 4.6 | 1.0 | 400 | 50:50 | 0.90 | 17.5 | 1.7 |
| 10 | 10 | p-type GaP:H:F<br>i-type A-Si:H:F<br>n-type A-SiGe:H:F | 4.5 | 1.1 | 400 | 51:49 | 0.89 | 17.3 | 1.5 |
| 11 | 11 | p-type GaP:H:F<br>i-type A-Si:H:F<br>n-type A-SiC:H:F | 4.5 | 1.0 | 400 | 50:50 | 0.95 | 18.2 | 1.8 |
| 12 | 12 | p-type GaP:H:F<br>i-type A-Si:H:F<br>n-type GaAs | 4.6 | 1.1 | 400 | 51:49 | 0.92 | 17.2 | 1.5 |
| 13 | 13 | p-type GaP:H:F<br>i-type A-Si:H<br>n-type GaP:H:F | *4.6<br>**4.3 | 1.1<br>0.8 | 400<br>350 | 50:50<br>50:50 | 0.95 | 17.8 | 1.8 |
| 14 | 14 | p-type GaP:H:F<br>i-type A-SiGe:H<br>n-type GaP:H:F | *4.6<br>**4.4 | 1.0<br>0.9 | 400<br>350 | 51:49<br>50:50 | 0.57 | 19.7 | 1.2 |
| 15 | 15 | p-type GaP:H:F<br>i-type A-SiC:H<br>n-type GaP:H:F | *4.5<br>**4.3 | 1.1<br>0.8 | 400<br>350 | 50:50<br>51:49 | 1.12 | 12.0 | 1.4 |
| 16 | 16 | p-type GaP:H:F<br>i-type A-Si:F<br>n-type GaP:H:F | *4.5<br>**4.3 | 1.1<br>0.9 | 400<br>350 | 50:50<br>50:50 | 0.88 | 17.2 | 1.3 |
| 17 | 17 | p-type GaP:H:F<br>i-type A-SiGeC:H<br>n-type GaP:H:F | *4.5<br>**4.2 | 1.0<br>0.8 | 400<br>350 | 51:49<br>50:50 | 0.62 | 19.0 | 1.2 |
| 18 | 18 | p-type GaP:H:F<br>i-type poly-Si:H<br>n-type GaP:H:F | *4.6<br>**4.3 | 1.0<br>0.9 | 400<br>350 | 50:50<br>51:49 | 0.55 | 18.2 | 1.2 |

*p-type
**n-type

TABLE 18

Conditions for the preparation of n-type A-SiGe:H:F film

| | |
|---|---|
| substrate temperature: | 220° C. |
| flow rate of $Si_2H_6$ gas: | 7 sccm |
| flow rate of $GeF_4$ gas: | 5 sccm |
| flow rate of $PH_3$ gas: (diluted by $H_2$ gas to 3000 ppm) | 5 sccm |
| flow rate of $H_2$ gas: | 200 sccm |
| inner pressure: | 1.2 Torr |
| high frequency power: | 32 W (13.56 MHz) |

TABLE 21

Conditions for the preparation of i-type A-Si: H film

| | |
|---|---|
| substrate temperature: 220° C. | |
| flow rate of $Si_2H_6$ gas: 12 sccm | |
| flow rate of $H_2$ gas: 200 sccm | |
| inner pressure: 1.3 Torr | |
| high frequency power: 33 W (13.56 MHz) | |

TABLE 22

Conditions for the preparation of i-type A-SiGe: H film substrate temperature: 220° C.
flow rate of $Si_2H_6$ gas: 10 sccm

TABLE 22-continued

Conditions for the preparation of i-type A-SiGe: H film flow rate of GeH$_4$ gas: 5 sccm
flow rate of H$_2$ gas: 280 sccm
inner pressure: 1.3 Torr
high frequency power: 30 W (13.56 MHz)

TABLE 23

Conditions for the preparation of i-type A-SiC: H film substrate temperature: 220° C.
flow rate of SiH$_4$ gas: 60 sccm
flow rate of CH$_4$ gas: 4 sccm
flow rate of H$_2$ gas: 280 sccm
inner pressure: 0.7 Torr
high frequency power: 45 W (13.56 MHz)

TABLE 24

Conditions for the preparation of i-type A-Si: F film target material: Si single-crystal wafer
substrate temperature: 220° C.
flow rate of Ar gas: 60 sccm
flow rate of F$_2$ gas: 3.5 sccm
inner pressure: 3 mTorr
high frequency power: 350 W (13.56 MHz)

TABLE 25

Conditions for the preparation of i-type A-SiGeC: H film substrate temperature: 220° C.
flow rate of SiH$_4$ gas: 40 sccm
flow rate of GeH$_4$ gas: 30 sccm
flow rate of CH$_4$ gas: 3 sccm
flow rate of H$_2$ gas: 250 sccm

TABLE 25-continued

Conditions for the preparation of i-type A-SiGeC: H film inner pressure: 0.6 Torr
high frequency power: 35 W (13.56 MHz)

TABLE 26

Conditions for the preparation of i-type poly-Si: H film target material: Si single-crystal wafer
substrate temperature: 220° C.
flow rate fo Ar gas: 30 sccm
flow rate of H$_2$ gas: 50 sccm
inner pressure: 3 mTorr
high frequency power: 350 W (13.56 MHz)

TABLE 27

| Example No. | Element Sample No. | semiconductor layer | characteristics of p-type GAP:H(F) film | | | | open-circuit voltage under irradiation of AM-1 light Voc [Volt] | short-circuit photocurrent under irradiation of AM-1 light Isc [mA/cm$^2$] | output value under irradiation of AM-1 light (using 400 nm interference filter) [relative value] |
|---|---|---|---|---|---|---|---|---|---|
| | | | hydrogen content (atomic %) | fluorine content (atomic %) | average crystal grain size (Å) | composition ratio of Ga to P | | | |
| 19 | 19 | p-type A-Si:H:F i-type A-Si:H:F n-type GaP:H:F | 4.1 | 0.8 | 350 | 50:50 | 0.91 | 17.1 | 1.3 |
| 20 | 20 | p-type A-SiC:H:F i-type A-Si:H:F n-type GaP:H:F | 4.2 | 0.9 | 350 | 51:49 | 0.92 | 18.1 | 1.7 |
| 21 | 21 | p-type ZnTe i-type A-Si:H:F n-type GaP:H:F | 4.2 | 0.8 | 350 | 51:49 | 0.89 | 17.0 | 1.3 |
| 22 | 22 | p-type GaP i-type A-Si:H:F n-type GaP:H:F | 4.2 | 0.9 | 350 | 50:50 | 0.91 | 17.2 | 1.5 |

TABLE 28

Conditions for the preparation of p-type ZnTe film target material: ZnTe polycrystal wafer
substrate temperature: 220° C.
flow rate of Ar gas: 70 sccm
flow rate of PH$_3$ gas: 15 sccm
(diluted by Ar gas to 2000 ppm)
inner pressure: 3 mTorr
high frequency power: 350 W (13.56 MHz)

TABLE 29

Conditions for the preparation of p-type GaP film target material: GaP polycrystal wafer
substrate temperature: 220° C.
flow rate of Ar gas: 70 sccm
flow rate of Ar gas for bubbling Zn(CH$_3$)$_2$: 5 sccm
inner pressure: 4 mTorr
high frequency power: 400 W (13.56 MHz)

TABLE 30

| | | semiconductor layer | open-circuit voltage under irradiation of AM-1 light Voc [Volt] | short-circuit photocurrent under irradiation of AM-1 light Isc [mA/cm$^2$] | ratio of change in the photoelectric conversion efficiency after 10 hours irradiation of AM-1 light [Δη/η%] |
|---|---|---|---|---|---|
| Example No. 23 Element Sample No. 23 | third layer | p-type GaP:H:F i-type A-SiC:H:F n-type A-Si:H:F | 2.70 | 12.2 | 2.2 |
| | second layer | p-type GaP:H:F i-type A-Si:H:F n-type A-Si:H:F | | | |
| | first layer | p-type GaP:H:F i-type A-SiGe:H:F n-type A-Si:H:F | | | |
| Comparative | third | p-type A-Si:H:F | 2.30 | 12.4 | 3.1 |

TABLE 30-continued

| | | semiconductor layer | open-circuit voltage under irradiation of AM-1 light Voc [Volt] | short-circuit photocurrent under irradiation of AM-1 light Isc [mA/cm²] | ratio of change in the photoelectric conversion efficiency after 10 hours irradiation of AM-1 light [Δη/η%] |
|---|---|---|---|---|---|
| example No. 5 | layer | i-type A-SiC:H:F n-type A-Si:H:F | | | |
| Element Sample No. 31 | second layer | p-type GaP:H:F i-type A-Si:H:F n-type A-Si:H:F | | | |
| | first layer | p-type GaP:H:F i-type A-SiGe:H:F n-type A-Si:H:F | | | |

TABLE 31

| Comparative Example No. | Element Sample No. | semiconductor layer | characteristics of p-type GaP:H(F) film | | | | open-circuit voltage under irradiation of AM-1 light Voc [Volt] | short-circuit photocurrent under irradiation of AM-1 light Isc [mA/cm²] | output value under irradiation of AM-1 light (using 400 nm interference filter) [relative value] |
|---|---|---|---|---|---|---|---|---|---|
| | | | hydrogen content (atomic %) | fluorine content (atomic %) | average crystal grain size (Å) | composition ratio of Ga to P | | | |
| 1 | 24 | p-type A-Si:H:F i-type A-Si:H:F n-type A-Si:H:F | — | — | — | — | 0.76 | 14.1 | 1.0 |
| 2 | 25 | p-type GaP:F i-type A-Si:H:F n-type A-Si:H:F | — | 6.6 | — | 32:68 | 0.31 | 5.9 | 0.11 |
| | 26 | p-type GaP:H:F i-type A-Si:H:F n-type A-Si:H:F | 0.4 | 2.4 | — | 40:60 | 0.48 | 10.1 | 0.42 |
| 3 | 27 | p-type GaP:H:F i-type A-Si:H:F n-type A-Si:H:F | 4.1 | 3.7 | 350 | 29:71 | 0.65 | 12.2 | 0.73 |
| 4 | 28 | p-type GaP:H:F i-type A-Si n-type A-Si:H:F | 4.5 | 1.2 | 400 | 50:50 | 0.15 | 2.5 | 0.05 |
| | 29 | p-type GaP:H:F i-type A-SiC n-type A-Si:H:F | 4.6 | 1.2 | 400 | 49:51 | 0.03 | 1.0 | 0.02 |
| | 30 | p-type GaP:H:F i-type A-SiGe n-type A-Si:H:F | 4.5 | 1.1 | 400 | 49:51 | 0.04 | 1.5 | 0.04 |

TABLE 32

| conditions | Element Sample No. | | |
|---|---|---|---|
| | 28 | 29 | 30 |
| target material | Si polycrystal wafer | SiC polycrystal wafer | SiGe polycrystal wafer |
| substrate temperature | 220° C. | 220° C. | 220° C. |
| flow rate of Ar gas | 30 sccm | 30 sccm | 30 sccm |
| inner pressure | 4 mTorr | 4 mTorr | 4 mTorr |
| high frequency power (13.56 MHz) | 320 W | 320 W | 320 W |

What we claim is:

1. A pin heterojunction photovoltaic element which generates photoelectromotive force by the junction of a p-type semiconductor layer, an i-type semiconductor layer and an n-type semiconductor layer, characterized in that at least one of said p-type and n-type semiconductor layers comprises a polycrystal semiconductor film comprised of gallium atoms (Ga), phosphorus atoms (P), hydrogen atoms (H), and atoms (M) of a p-type or n-type dopant element, said polycrystal semiconductor film contains crystal grains of an average size in the range of 50 to 1000 Å, and said polycrystal semiconductor film contains the hydrogen atoms (H) in an amount of 0.5 to 5 atomic %; and said i-type semiconductor layer comprises a non-single crystal semiconductor film containing silicon atoms (Si) as a matrix and at least one kind of atoms selected from the group consisting of hydrogen atoms (H) and fluorine atoms (F).

2. A pin hetrojunction photovoltaic element according to claim 1, wherein said polycrystal semiconductor film further contains fluorine atoms (F) in an amount of 3 atomic % or less.

3. A pin heterojunction photovoltaic element which generates photoelectromotive force by the junction of a p-type semiconductor layer, an i-type semiconductor layer and an n-type semiconductor layer, characterized in that at least one of said p-type and n-type semiconductor layers comprises a polycrystal semiconductor film comprised of gallium atoms (Ga), phosphorus atoms (P), hydrogen atoms (H), and atoms (M) of a p-type or n-type dopant element, said polycrystal semiconductor film contains crystal grains of an average size in the range of 50 to 1000 Å, and said polycrystal semiconductor film contains the hydrogen atoms (H) in an amount of 0.5 to 5 atomic %; and said i-type semiconductor layer comprises a non-single crystal semiconductor film containing silicon atoms (Si) as a matrix, at least one kind of atoms selected from the group consisting of carbon atoms (C) and germanium atoms (Ge), and at least one kind of atoms selected from the group consisting of hydrogen atoms (H) and fluorine atoms (F).

4. A pin heterojunction photovoltaic element according to claim 3, wherein said polycrystal semiconductor film further contains fluorine atoms in an amount of 3 atomic % or less.

* * * * *

UNITED STATES PATENT AND TRADEMARK OFFICE
CERTIFICATE OF CORRECTION

PATENT NO. : 5,006,180
DATED : April 9, 1991
INVENTOR(S) : MASAHIRO KANAI, ET AL.

It is certified that error appears in the above-identified patent and that said Letters Patent is hereby corrected as shown below:

Title Page:
IN [57] ABSTRACT

Line 11, "rage" should read --range--.

COLUMN 1

Line 20, "pn" should read --pin--.
Line 39, "pn" should read --pin--.
Line 49, "lies" should read --which lies--.
Line 68, "microcrystal line" should read --microcrystalline--.

COLUMN 5

Line 5, "juction" should read --junction--.
Line 7, "semicondeuctor" should read --semiconductor--.

COLUMN 7

Line 51, "recognize" should read --recognized--.
Line 52, "radical" should read --radicals--.
Line 54, "found" should read --been found--.

COLUMN 9

Line 1, "radical" should read --radicals--.
Line 22, "at least" should be deleted.

COLUMN 12

Line 38, "symbol "⊙"" should read --symbol "○"--.
Line 50, "symbol "○"" should read --symbol "⊙"--.

UNITED STATES PATENT AND TRADEMARK OFFICE
CERTIFICATE OF CORRECTION

PATENT NO. : 5,006,180
DATED : April 9, 1991
INVENTOR(S) : MASAHIRO KANAI, ET AL.

It is certified that error appears in the above-identified patent and that said Letters Patent is hereby corrected as shown below:

COLUMN 15

Line 6, "to" should be deleted.

COLUMN 16

Line 60, "$Si_2H_3F_2)_5$" should read --$(Si_2H_3F_2)_5$--.
Line 68, "$Sn(tOC_4H_9)_4$" should read --$Sn(t-OC_4H_9)_4$--.

COLUMN 17

Line 48, "of" should read --at--.

COLUMN 18

Line 18, "n-type)" should read --p-type)--.

COLUMN 20

Line 37, "stransmissive" should read --transmissive--.

COLUMN 21

Line 6, "n type" should read --n-type--.

COLUMN 23

Line 57, "a-siC:H:F" should read --a-SiC:H:F--.

COLUMN 24

Line 9, "i-type" should read --p-type--.
Line 65, "Nos" should read --Nos.--.

UNITED STATES PATENT AND TRADEMARK OFFICE
CERTIFICATE OF CORRECTION

PATENT NO. : 5,006,180
DATED : April 9, 1991
INVENTOR(S) : MASAHIRO KANAI, ET AL.

It is certified that error appears in the above-identified patent and that said Letters Patent is hereby corrected as shown below:

COLUMN 25

Line 46, "an other" should read --another--.

COLUMN 26

Line 61, "have" should read --having--.

COLUMN 28

Line 35, "a" should read --an--.
    Line 37, "about" should read --an about--.

COLUMN 33

Line 10, "mol/min" should read --mol/min.--.
    Line 51, "comb shaped" should read --comb-shaped--.

COLUMN 34

Line 40, "int he" should read --in the--.

COLUMN 36

Line 2, "int he" should read --in the--.

COLUMN 37

Line 18, "p type" should read --p-type--.

UNITED STATES PATENT AND TRADEMARK OFFICE
CERTIFICATE OF CORRECTION

PATENT NO. : 5,006,180
DATED : April 9, 1991
INVENTOR(S) : MASAHIRO KANAI, ET AL.

It is certified that error appears in the above-identified patent and that said Letters Patent is hereby corrected as shown below:

COLUMN 38

Line 5, "on" should be deleted.
   Line 31, "in stead" should read --instead--.

COLUMN 39

Line 6, "gas" should read --gas.--.
   Line 13, "laye" should read --layer--.
   Line 16, "ductor" should read --ductor layer--.
   Line 58, "semiconductor" should read
           --semiconductor layer--.

COLUMN 40

Line 23, "29." should read --Table 29.--.
   Line 30, "laye" should read --layer--.
   Line 32, "semiconductor" should read
           --semiconductor layer--.

COLUMN 41

Line 9, "a" (second occurrence) should read --a- --.

COLUMN 42

Line 16, "Fig. (A)" should read --Fig. 1 (A)--.

COLUMN 45

Line 7, "p-type a-Si:H:F," should read
           --p-type a-Si:H:F film,--.

UNITED STATES PATENT AND TRADEMARK OFFICE
CERTIFICATE OF CORRECTION

PATENT NO. : 5,006,180
DATED : April 9, 1991
INVENTOR(S) : MASAHIRO KANAI, ET AL.

It is certified that error appears in the above-identified patent and that said Letters Patent is hereby corrected as shown below:

COLUMNS 49-50

TABLE 7 and TABLE 7-continued,

" total evaluation
X
X
X
O
O
O
O
O
O
X
X
X
O
O
O
O
O
O
O
O
O
O
O
X
X
X
X
X
X
X
O
O
O
O
X
X "

should read

-- total evaluation
X
X
X
O
⊙
⊙
⊙
⊙
X
X
X
O
⊙
⊙
O
X
X
X
X
X
⊙
O
⊙
⊙
X
X --.

UNITED STATES PATENT AND TRADEMARK OFFICE
CERTIFICATE OF CORRECTION

PATENT NO. : 5,006,180
DATED : April 9, 1991
INVENTOR(S) : MASAHIRO KANAI, ET AL.

It is certified that error appears in the above-identified patent and that said Letters Patent is hereby corrected as shown below:

COLUMN 50

TABLE 7-continued,

```
        "   : excellent      should     -- ◉: excellent
            : good    "      read          O: good    --.
TABLE 8, "106    A-Si:HF:F       X    X" should read
         --106   A-Si:H:F        X    X--.
TABLE 8, "   : excellent      should     -- ◉: excellent
             : good    "      read          O: good    --.
```

COLUMN 53

TABLE 16, "gas:" should read --gas):--.

COLUMN 54

TABLE 17, "Isc [mA/CM$^2$]" should read --Isc [mA/cm$^2$]--.

Signed and Sealed this

Eighth Day of December, 1992

Attest:

DOUGLAS B. COMER

Attesting Officer

Acting Commissioner of Patents and Trademarks